United States Patent
Ui et al.

(10) Patent No.: US 8,446,483 B2
(45) Date of Patent: May 21, 2013

(54) BINARY CONVERSION CIRCUIT AND METHOD, AD CONVERTER, SOLID-STATE IMAGING DEVICE, AND CAMERA SYSTEM

(75) Inventors: Hiroki Ui, Tokyo (JP); Tomohiro Takahashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 432 days.

(21) Appl. No.: 12/659,877

(22) Filed: Mar. 24, 2010

(65) Prior Publication Data
US 2010/0271519 A1    Oct. 28, 2010

(30) Foreign Application Priority Data
Apr. 24, 2009  (JP) .................... 2009-106961

(51) Int. Cl.
*H04N 5/235*  (2006.01)
*H04N 3/14*   (2006.01)
*H03M 1/12*   (2006.01)

(52) U.S. Cl.
USPC .............. 348/222.1; 348/294; 341/155

(58) Field of Classification Search
USPC ......... 348/222.1, 241, 294, 300, 302; 341/52, 341/155
See application file for complete search history.

(56) References Cited

U.S. PATENT DOCUMENTS

| 5,877,715 | A  | * | 3/1999 | Gowda et al. ............... 341/122 |
| 6,947,077 | B1 | * | 9/2005 | Krymski ..................... 348/222.1 |
| 7,995,123 | B2 | * | 8/2011 | Lee et al. .................... 348/294 |
| 8,208,055 | B2 | * | 6/2012 | Hiyama ....................... 348/300 |
| 2002/0051067 | A1 | * | 5/2002 | Henderson et al. .......... 348/241 |
| 2005/0195304 | A1 |   | 9/2005 | Nitta et al. |
| 2006/0012698 | A1 |   | 1/2006 | Nitta et al. |
| 2009/0231479 | A1 | * | 9/2009 | Zarnowski et al. ......... 348/302 |

FOREIGN PATENT DOCUMENTS
JP   2005-278135         10/2005
JP   2006-033453  A       2/2006

* cited by examiner

*Primary Examiner* — Trung Diep
(74) *Attorney, Agent, or Firm* — Rader, Fishman & Grauer PLLC

(57) ABSTRACT

A binary conversion circuit includes: a latch circuit that latches phase information of at least one clock signal when the level of a signal is inverted, the level of the signal being inverted based on its state; at least one conversion circuit that converts the latched phase information of the latch circuit to a pulse train in response to a pulse signal; and a ripple counter section that converts phase information of a clock to a binary code by using the pulse obtained by the conversion of the conversion circuit as a count clock.

22 Claims, 22 Drawing Sheets

FIG.1 RELATED ART
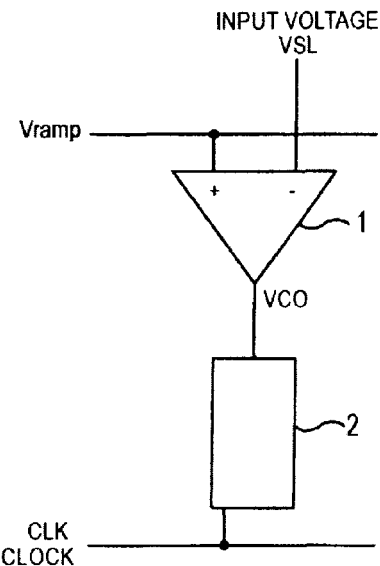
FIG.2 RELATED ART
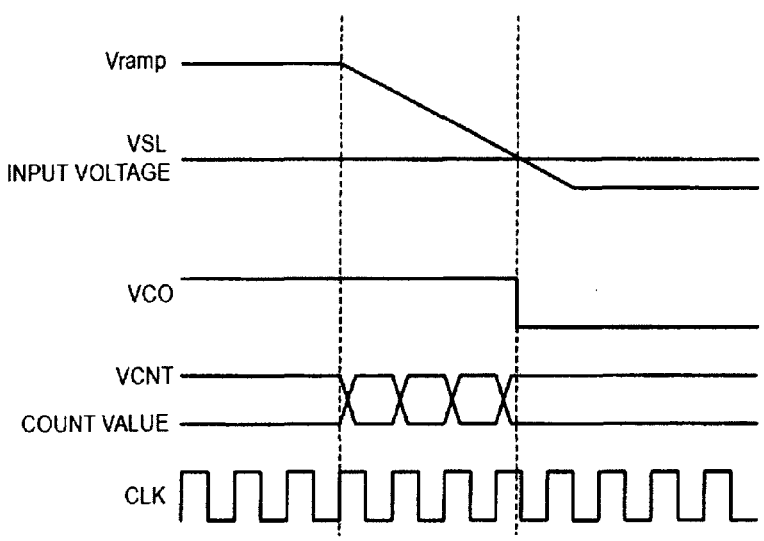

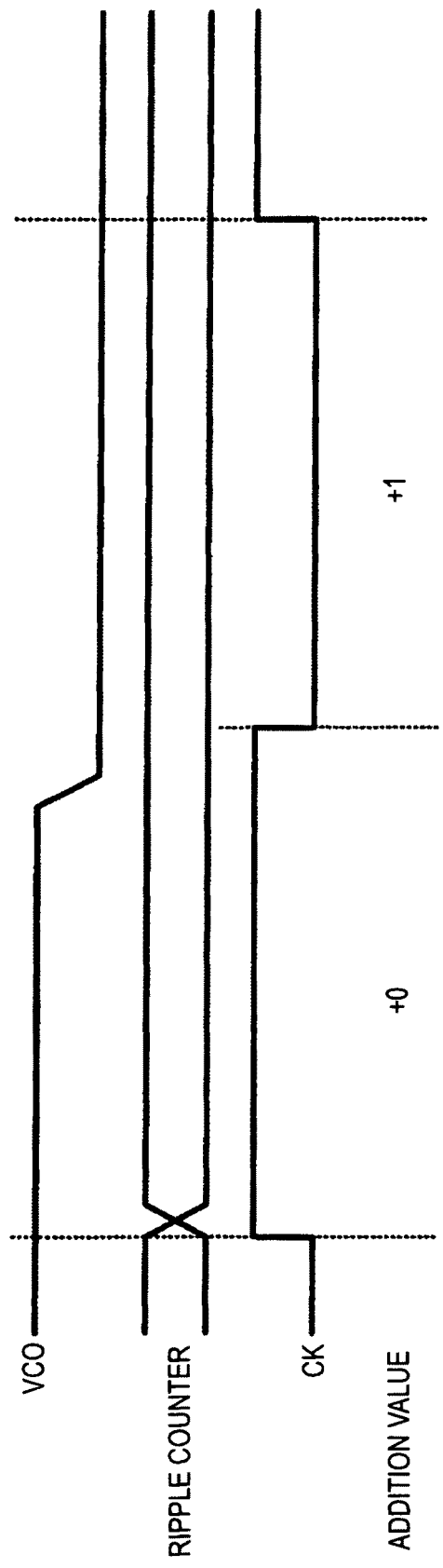

WHEN EB=0

WHEN EB=1

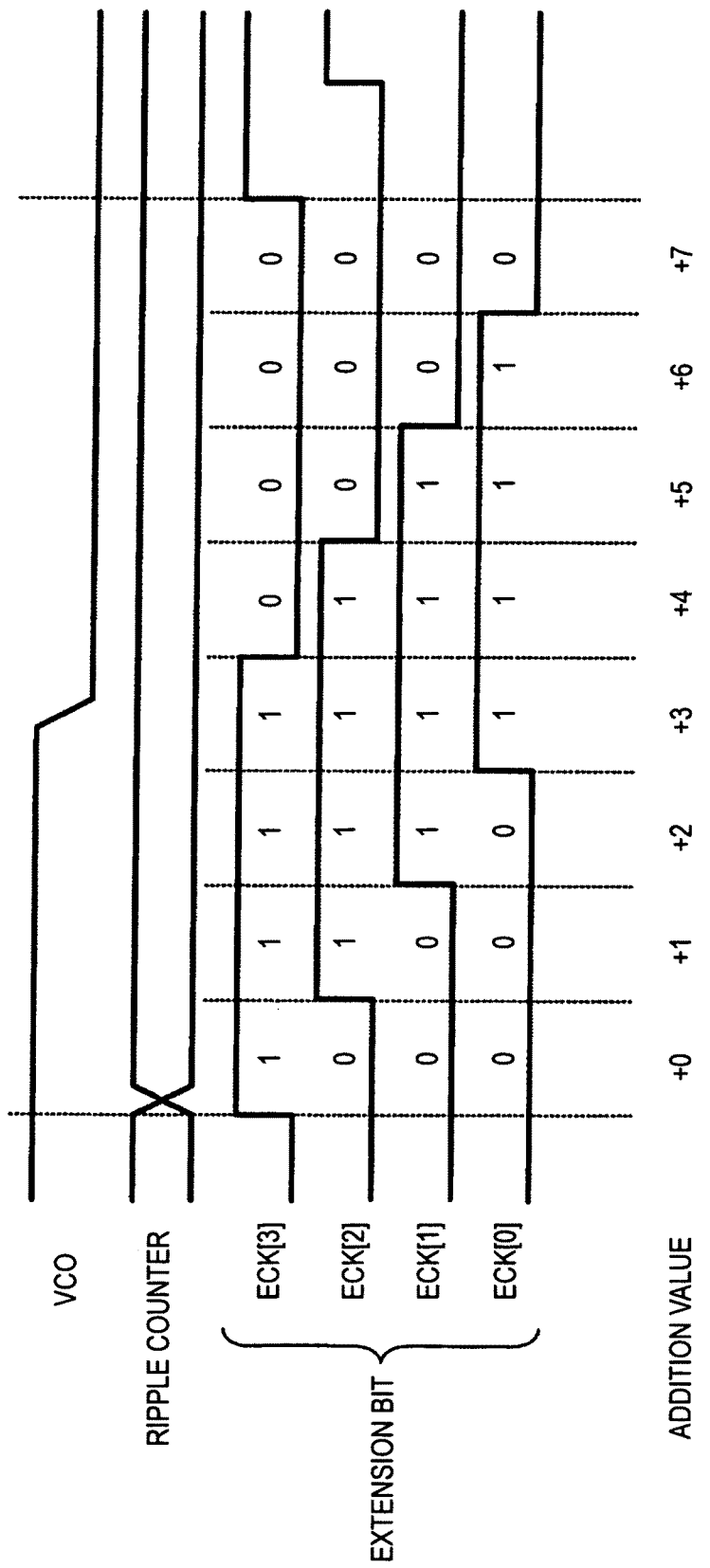

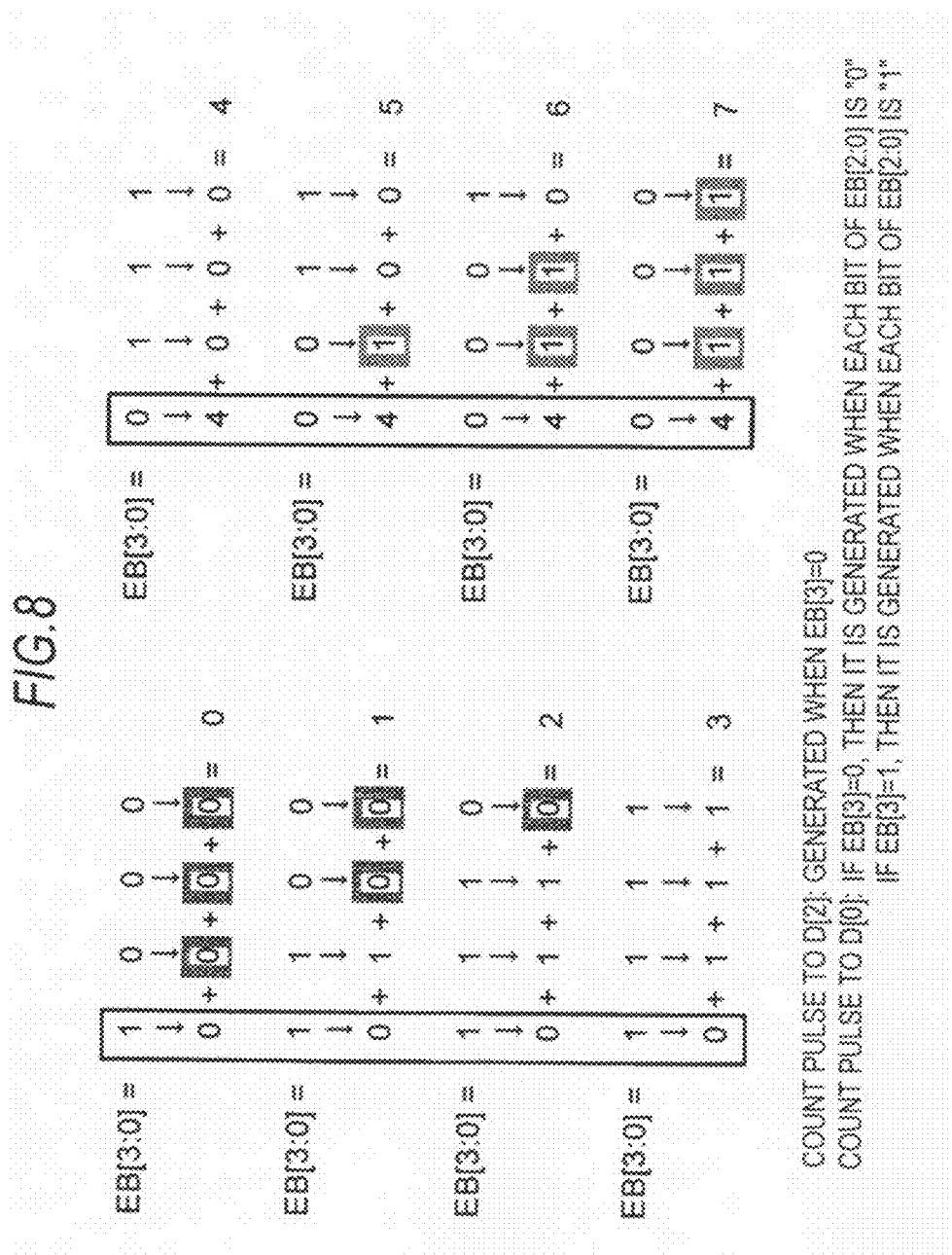

COUNT PULSE TO D[0]: ONE COUNT PULSE IS ALWAYS GENERATED WHEN EACH BIT OF EB[2:0] IS "1"
THE FOLLOWING RULES ARE APPLIED WHEN EACH BIT OF EB[2:0] IS "0"
IF EB[3]=1, THEN NO COUNT PULSE IS GENERATED
IF EB[3]=0, THEN TWO COUNT PULSES ARE GENERATED WHEN EACH BIT OF EB[2:0] IS 0

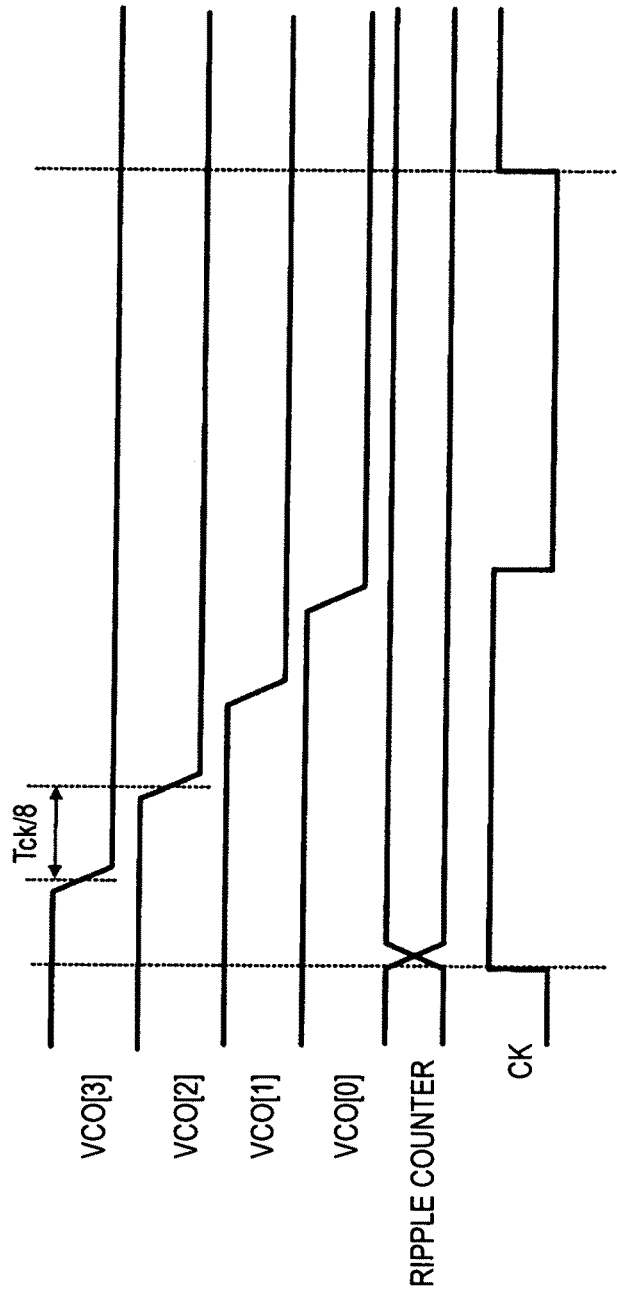

FIG. 18

BINARY CONVERSION CIRCUIT AND METHOD, AD CONVERTER, SOLID-STATE IMAGING DEVICE, AND CAMERA SYSTEM

BACKGROUND OF THE INVENTION

1. Field of the Invention

The present invention relates to a binary conversion circuit and method that can be applied to a solid-state imaging device represented by a CMOS image sensor, an analog-to-digital (AD) converter, a solid-state imaging device, and a camera system.

2. Description of the Related Art

Hitherto, in the field of image sensors, a structure has been proposed in which a comparator that compares a pixel output and a ramp-shaped reference potential with each other and a ripple counter for measuring the time elapsed until the pixel output and the reference potential cross each other are provided for each column. Such a structure is disclosed in JP-A-2006-033453 and JP-A-2005-278135, for example.

FIG. 1 is a diagram showing a typical circuit example that has a comparator and a counter.

FIG. 2 is a timing chart of the circuit in FIG. 1.

In this circuit, a count operation of a counter 2 is started when a comparator 1 starts sweeping a reference voltage Vramp.

When the reference voltage Vramp is lower than an input voltage VSL, an output signal VCO of the comparator 1 is inverted from a high level to a low level, and the count operation of the counter 2 is stopped at this falling edge.

A count value VCNT is in one-to-one correspondence to a voltage width that the reference voltage Vramp has swept, and the count value VCNT reflects an analog-to-digital (AD) conversion result for the input voltage.

In JP-A-2006-033453 and JP-A-2005-278135, a ripple counter is used as the counter, and a subtraction operation is realized by inverting each bit of the ripple counter.

Moreover, an addition operation is realized by continuously operating the ripple counter with subsequent data while holding the count value for the first data.

According to this configuration, since a CDS (Correlated Double Sampling) operation which is frequently performed in an image sensor is performed individually in each column, an AD conversion result of a pixel output does not depend on an inter-column clock skew or a reference potential skew.

As a consequence, a count operation based on a high-frequency clock is possible. Moreover, since the AD conversion results are added or subtracted in units of columns, it is advantageous in that an addition operation of the pixel output in the same column can be performed on an AD converter circuit.

SUMMARY OF THE INVENTION

However, such circuits have a great limitation in that the circuits generally have to be laid out in a width substantially equal to the size of a pixel array, they have the following disadvantages. (1) Such a layout results in a thin layout extending in a column direction, and thus a critical path appears in that direction. (2) It is hard to dispose a large buffer. Thus, it is difficult to realize a high-speed operation compared to a typical counter circuit.

Moreover, even when a high-speed operation is realized by using a large buffer in a circuit, since such counter circuits are provided by the number of pixel columns, power consumption becomes an issue, which suggests another problem for increasing high speed operations.

In general, a counter is capable of performing a count operation in only clock units. However, by supplying phase information of the clock at the falling edge of the output signal VCO to the comparator, it may be possible to obtain a count value in finer units.

For example, clocks having different phases may be latched at the determination timings of the comparator.

Alternatively, as in a TDC (Time-to-Digital Converter), by using phase information of a clock signal without increasing the clock frequency itself, a count operation may be performed in a smaller time unit than a clock cycle.

However, such phase information is not a binary code, with the phase information as it is, it may be difficult to perform the CDS operation as described above or an inter-pixel addition/subtraction operation in a column.

It is therefore desirable to provide a binary conversion circuit which is so small that it can be easily integrated into an image sensor and consumes less power and which is capable of converting clock phase information to a binary value and realizing digital addition and subtraction. It is also desirable to provide a binary conversion method thereof, and an AD converter, a solid-state imaging device, and a camera system employing the binary conversion circuit and method.

A binary conversion circuit according to an embodiment of the present invention includes a latch circuit that latches phase information of at least one clock signal when the level of a signal is inverted, the level of the signal being inverted based on its state; at least one conversion circuit that converts the latched phase information of the latch circuit to a pulse train in response to a pulse signal; and a ripple counter section that converts phase information of a clock to a binary code by using the pulse obtained by the conversion of the conversion circuit as a count clock.

A binary conversion method according to another embodiment of the present invention includes the steps of: latching phase information of at least one clock signal when the level of a signal is inverted, the level of the signal being inverted based on its state; converting the latched phase information to a pulse train in response to a pulse signal; and converting the phase information to a binary value by using the pulse obtained by the conversion as a count clock of a ripple counter.

An analog-to-digital (AD) converter according to still another embodiment of the present invention includes a comparator that compares an input voltage with a reference voltage having a ramp waveform whose voltage value varies linearly with time; a latch circuit that latches phase information of at least one clock signal when the level of an output signal of the comparator is inverted; at least one conversion circuit that converts latched phase information of the latch circuit to a pulse train in response to a pulse signal; and a ripple counter section that converts phase information of a clock to a binary code by using the pulse obtained by the conversion of the conversion circuit as a count clock.

A solid-state imaging device according to yet another embodiment of the present invention includes a pixel section including a plurality of pixels arranged in a matrix form, each of the pixels being configured to perform a photoelectric conversion; and a pixel signal readout section that reads out a pixel signal from the pixel section in units of a plurality of pixels. The pixel signal readout section has an analog-to-digital (AD) converter that is disposed to correspond to a column array of pixels so as to convert a readout analog signal to a digital signal. The AD converter includes a comparator that compares an input voltage with a reference voltage having a ramp waveform whose voltage value varies linearly with time, a latch circuit that latches phase information of at least one clock signal when the level of an output signal of the comparator is inverted, at least one conversion circuit that converts latched phase information of the latch circuit to a pulse train in response to a pulse signal, and a ripple counter section that converts phase information of a clock to a binary code by using the pulse obtained by the conversion of the conversion circuit as a count clock.

A camera system according to still yet another embodiment of the present invention includes a solid-state imaging device; and an optical system that forms a subject image in the solid-state imaging device, wherein the solid-state imaging device includes a pixel section including a plurality of pixels arranged in a matrix form, each of the pixels being configured to perform a photoelectric conversion, and a pixel signal readout section that reads out a pixel signal from the pixel section in units of a plurality of pixels, wherein the pixel signal readout section has an analog-to-digital (AD) converter that is disposed to correspond to a column array of pixels so as to convert a readout analog signal to a digital signal, and wherein the AD converter includes a comparator that compares an input voltage with a reference voltage having a ramp waveform whose voltage value varies linearly with time, a latch circuit that latches phase information of at least one clock signal when the level of an output signal of the comparator is inverted, at least one conversion circuit that converts latched phase information of the latch circuit to a pulse train in response to a pulse signal, and a ripple counter section that converts phase information of a clock to a binary code by using the pulse obtained by the conversion of the conversion circuit as a count clock.

According to the embodiments of the present invention, the binary conversion circuit can be made so small that it can be easily integrated into an image sensor and consumes less power and is capable of converting clock phase information to a binary value and realizing digital addition and subtraction.

BRIEF DESCRIPTION OF THE DRAWINGS

FIG. 1 is a diagram showing a typical circuit example that has a comparator and a counter.

FIG. 2 is a timing chart of the circuit in FIG. 1.

FIG. 4 is a timing chart showing the operation of the AD converter shown in FIG. 3.

FIG. 7 is a timing chart showing the operation of the AD converter shown in FIG. 6.

FIG. 8 is a diagram showing the correspondence between an extension code and a count value.

FIG. 12 is a diagram showing the correspondence between an extension code and a count value.

FIG. 14 is a timing chart according to the fourth embodiment.

FIG. 18 is a diagram showing the correspondence between an extension code and a count value in the AD converter shown in FIG. 17.

DESCRIPTION OF THE PREFERRED EMBODIMENTS

Embodiments of the present invention will be described in connection with the accompanying drawings.

The description will be given in the following order:
1. First Embodiment (First Exemplary Configuration of AD Converter);
2. Second Embodiment (Second Exemplary Configuration of AD Converter);
3. Third Embodiment (Third Exemplary Configuration of AD Converter);
4. Fourth Embodiment (Fourth Exemplary Configuration of AD Converter);
5. Fifth Embodiment (Fifth Exemplary Configuration of AD Converter);
6. Sixth Embodiment (Exemplary Overall Configuration of Solid-State Imaging Device); and
7. Seventh Embodiment (Exemplary Configuration of Camera System)

1. First Embodiment

First Exemplary Configuration of AD Converter

Figure 3:
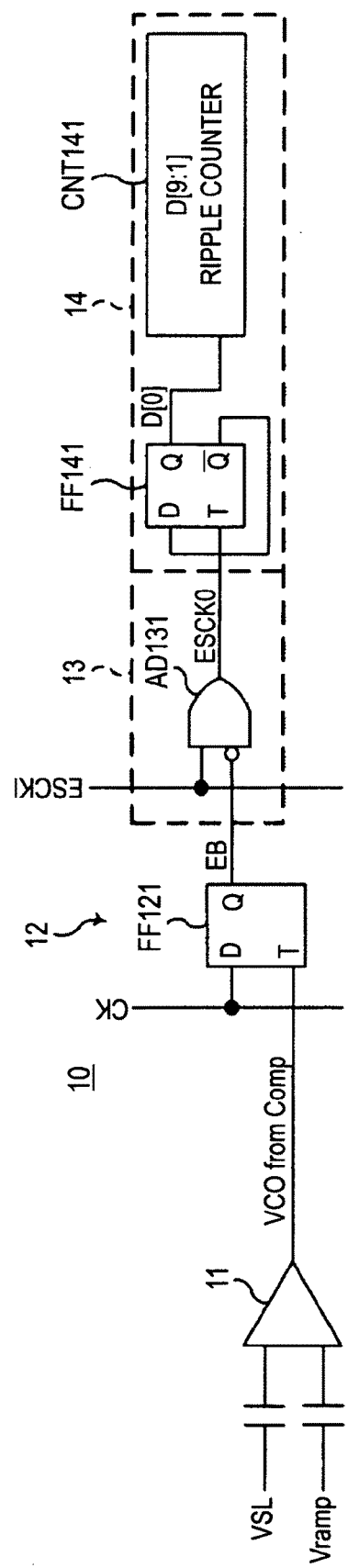
FIG. 3 is a diagram showing an exemplary configuration of an AD converter according to a first embodiment of the present invention.

FIG. 3 is a diagram showing an exemplary configuration of an AD converter according to the first embodiment of the present invention.

This analog-to-digital (AD) converter 10 according to the first embodiment has a comparator 11, a latch circuit 12, a conversion circuit 13, and a ripple counter section 14.

The latch circuit 12, the conversion circuit 13, and the ripple counter section 14 forms a binary conversion circuit.

The comparator 11 compares an input voltage VSL with a reference voltage Vramp having a ramp waveform whose voltage value varies linearly with time and outputs an output signal VCO having a level corresponding to a comparison result to the latch circuit 12.

The latch circuit 12 latches phase information of a clock signal CK when the level of the output signal VCO of the comparator 11 is inverted, and outputs latched data EB to the conversion circuit 13.

The latch circuit 12 has a T-type flip-flop FF121 as shown in FIG. 3.

The flip-flop FF121 has an input D connected to a supply line of the clock signal CK, a terminal T connected to an output line of the output signal VCO of the comparator 11, and an output Q connected to the conversion circuit 13.

The conversion circuit 13 converts the latched information of the latch circuit 12 to a pulse (train) in response to a pulse signal ESCKI and outputs the pulse to the ripple counter section 14 as a count clock.

The conversion circuit 13 has an AND gate AD131.

The AND gate AD131 has a positive input terminal connected to the supply line of the pulse signal ESCKI and a negative input terminal connected to the supply line of the latch signal EB.

The ripple counter section 14 converts the phase information of the clock signal to a binary code as a least significant bit of a ripple counter CNT141 in response to the count clock of the conversion circuit 13.

The ripple counter section 14 has a flip-flop FF141 and the ripple counter CNT141.

The flip-flop FF141 has an input D connected to its inverted output /Q (where "/" represents inversion), a terminal T connected to a supply line of an output signal ESCKO of the AND gate AD131 of the conversion circuit 13, and an output Q connected to an input terminal of the ripple counter CNT141.

The flip-flop FF131 functions as a storage element (latch) for storing binarized data.

FIG. 4 is a timing chart showing the operation of the AD converter shown in FIG. 3.

Figure 5A:
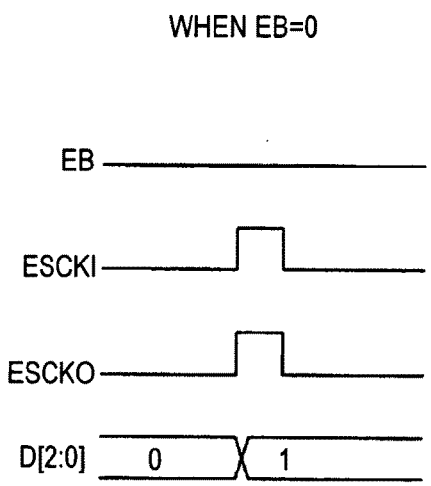
FIGS. 5A and 5B are timing charts showing the operation of the AD converter shown in FIG. 3, showing the operation state corresponding to the latched information of a latch circuit.
Figure 5B:
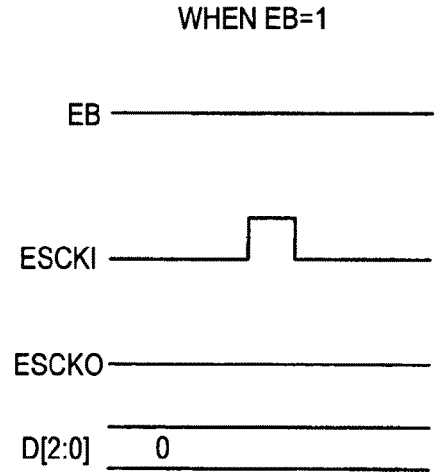

FIGS. 5A and 5B are timing charts showing the operation of the AD converter shown in FIG. 3. Specifically, FIG. 5A shows the operation state when the latched information EB of a latch circuit is 0, and FIG. 5B shows the operation state when the latched information EB of the latch circuit is 1.

Next, the operation of the AD converter shown in FIG. 3 will be described in connection with FIGS. 4, 5A, and 5B.

In the comparator 11, the reference voltage Vramp having a ramp waveform whose voltage value varies linearly with time is compared with the input voltage VSL, and the output signal VCO having a level corresponding to the comparison result is input to the latch circuit 12.

In the latch circuit 12, the phase information of the clock signal CK is latched at the time when the level of the output signal VCO of the comparator 11 is inverted.

In the conversion circuit 13, the pulse signal ESCKI is masked in response to the latch signal EB which is the latched information, and the count clock corresponding to this masking state is generated and supplied to the ripple counter 14.

As shown in FIGS. 5A and 5B, a count-up operation of +0 is performed when the latch signal EB is 1, and a count-up operation of +1 is performed when the latch signal EB is 0.

That is, when the pulse signal ESCKI is masked by the latch signal EB, namely EB=1, as shown in FIG. 5B, the output signal ESCKO of the AND gate AD131 is fixed at a low level (L).

When EB=0, as shown in FIG. 5A, a pulse appears in the output signal ESCKO, and the ripple counter CNT141 is toggled by an output D[0] of the flip-flop FF141 to perform a count-up of +1.

The phase information of such a clock signal is converted to a binary code as a least significant bit of the ripple counter CNT141.

According to the first embodiment, the AD converter 10 has a small size and thus consumes less power and is capable of converting clock phase information to binary values and realizing digital addition and subtraction.

2. Second Embodiment

Second Exemplary Configuration of AD Converter

Figure 6:
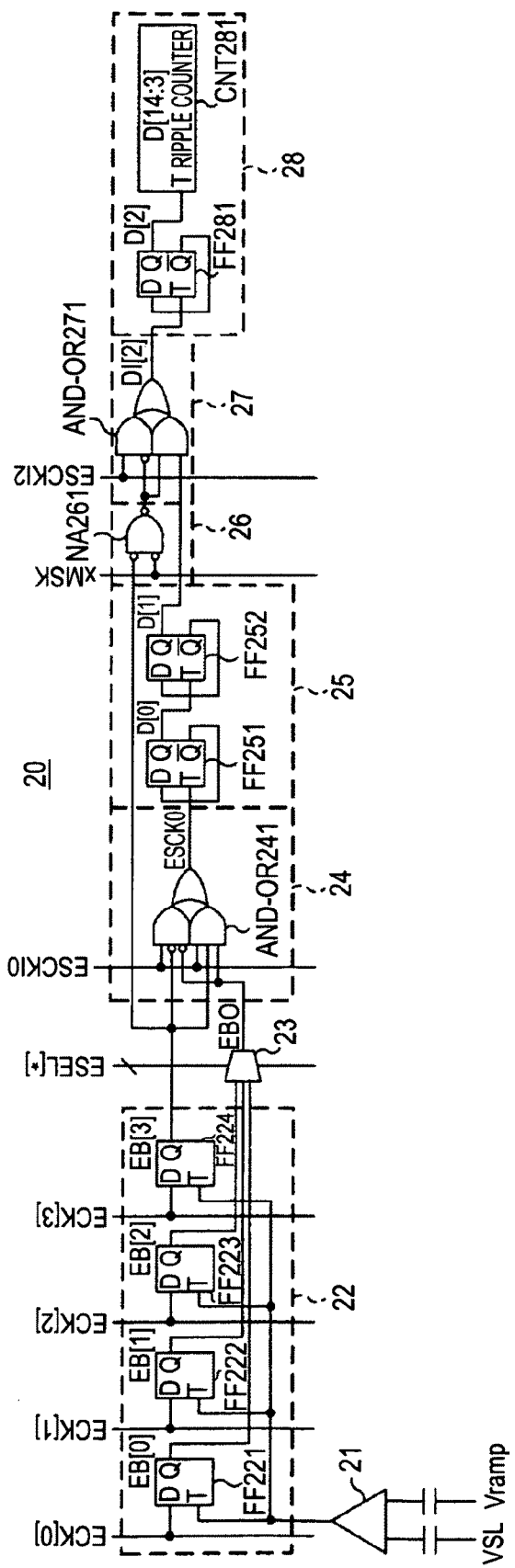
FIG. 6 is a diagram showing an exemplary configuration of an AD converter according to a second embodiment of the present invention.

FIG. 6 is a diagram showing an exemplary configuration of an AD converter according to the second embodiment of the present invention.

In the second embodiment, a case where a multi-phase clock signal is latched will be described.

This AD converter 20 according to the second embodiment has a comparator 21, a latch circuit 22, a selector 23, a first conversion circuit 24, a first ripple counter section 25, a mask circuit 26, a second conversion circuit 27, and a second ripple counter section 28.

The latch circuit 22, the selector 23, the first conversion circuit 24, the first ripple counter section 25, the mask circuit 26, the second conversion circuit 27, and the second ripple counter section 28 forms a binary conversion circuit.

The comparator 21 compares an input voltage VSL with a reference voltage Vramp having a ramp waveform whose voltage value varies linearly with time and outputs an output signal VCO having a level corresponding to a comparison result to the latch circuit 22.

Basically, the latch circuit 22 latches phase information of a plurality of clock signals having different phases when the level of the output signal VCO of the comparator 21 is inverted, and outputs a part of the latched value to the selector 23 and the first conversion circuit 24.

In this example, as the plurality of clock signals having different phases, four clock signals ECK[3], ECK[2], ECK[1], and ECK[0] are used. The clock signals ECK[2], ECK[1], and ECK[0] have respective phases which are sequentially shifted by 45° from the phase of the clock signal ECK[3].

The phase difference 45° corresponds to ⅛ of a clock cycle Tck.

The latch circuit 22 shown in FIG. 6 has flip-flops FF221, FF222, and FF223 serving as first latches and a flip-flop FF224 serving as a second latch.

The flip-flops FF221 to FF224 latch the phase information of the clock signals ECK[0], ECK[1], ECK[2], and ECK[3], respectively, in synchronism with the output signal VCO of the comparator 21.

The flip-flop FF221 latches the phase information of the clock signal ECK[0] in synchronism with the output signal VCO of the comparator 21. An extension code EB[0] is obtained from the Q output of the flip-flop FF221, and the flip-flop FF221 outputs the extension code EB[0] to the selector 23.

The flip-flop FF222 latches the phase information of the clock signal ECK[1] in synchronism with the output signal VCO of the comparator 21. An extension code EB[1] is obtained from the Q output of the flip-flop FF222, and the flip-flop FF222 outputs the extension code EB[1] to the selector 23.

The flip-flop FF223 latches the phase information of the clock signal ECK[2] in synchronism with the output signal VCO of the comparator 21. An extension code EB[2] is obtained from the Q output of the flip-flop FF223, and the flip-flop FF223 outputs the extension code EB[2] to the selector 23.

The flip-flop FF224 latches the phase information of the clock signal ECK[3] in synchronism with the output signal VCO of the comparator 21. An extension code EB[3] is obtained from the Q output of the flip-flop FF224, and the flip-flop FF224 outputs the extension code EB[3] to the first conversion circuit 24.

The selector 23 sequentially selects the extension codes EB[0], EB[1], and EB[2] output from the flip-flops FF221 to FF223 in response to a select signal ESEL[*] and outputs the selected extension code to the first conversion circuit 24 as a signal EB0.

The first conversion circuit 24 converts the extension codes EB[0] to EB[3], which are the latched information of the latch circuit 22, to a pulse (train) in response to a pulse signal ESCKI0 and outputs the pulse signal ESCKI0 to the first ripple counter section 25 as a count clock.

The first conversion circuit 24 has an AND-OR gate AOR241.

A first 3-input AND gate of the AND-OR gate AOR241 has a first input terminal connected to a supply line of the pulse signal ESCKI0, a second negative input terminal connected to an output line of the extension code EB[3], and a third negative input terminal connected to a supply line of the signal EB0 of the selector 23.

A second 3-input AND gate of the AND-OR gate AOR241 has a first input terminal connected to a supply line of the pulse signal ESCKI0, a second input terminal connected to the output line of the extension code EB[3], and a third input terminal connected to the supply line of the signal EB0 of the selector 23.

The first ripple counter section 25 converts the phase information of the clock signals to a binary code as a lower bit in response to the count clock of the first conversion circuit 24.

The first ripple counter section 25 has vertically connected T-type flip-flops FF251 and FF252 as storage elements.

The flip-flop FF251 has a terminal T connected to the supply line of the signal ESCK0 of the first conversion circuit 24, an input D connected to its inverted output /Q, and an output Q connected to a terminal T of the flip-flop FF252.

The flip-flop FF252 has a D input connected to its inverted output /Q and an output Q connected to the second conversion circuit 27.

The mask circuit 26 performs mask processing for determining whether or not the extension code EB[3] of the latch circuit 22 will be input to the second conversion circuit 27 based on a mask signal xMSK.

The mask circuit 26 has an NAND gate NA 261 having two negative inputs.

The NAND gate NA 261 has a first input terminal connected to the supply line of the extension code EB[3] of the latch circuit 22 and a second input terminal connected to a supply line of the mask signal xMSK which is active at a low level.

The second conversion circuit 27 converts the extension code EB[3] of the latch circuit 22 to a pulse (train) in response to a pulse signal ESCKI2 and outputs the converted pulse signal D[2] as a count clock of the second ripple counter section 28.

The second conversion circuit 27 has an AND-OR gate AOR271.

A first 2-input AND gate of the AND-OR gate AOR271 has a first input terminal connected to a supply line of the pulse signal ESCKI2 and a second negative input terminal connected to an output terminal of the mask circuit 26.

A second 2-input AND gate of the AND-OR gate AOR271 has a first input terminal connected to the output terminal of the mask circuit 26 and a second input terminal connected to an output line of an output D[1] of the first ripple counter section 25.

Then, the AND-OR gate AOR271 outputs an output signal DI[2] to the second ripple counter section 28.

The second ripple counter section 28 converts the phase information of the clock signals to a binary code as an upper bit of a ripple counter in response to the count clock of the second conversion circuit 27.

The second ripple counter section 28 has a flip-flop FF281 and a ripple counter CNT281.

The flip-flop FF281 has an input D connected to its inverted output /Q (where "/" represents inversion), a terminal T connected to a supply line of the output signal DI[2] of the second conversion circuit 27, and an output Q connected to an input terminal of the ripple counter CNT281.

The flip-flop FF281 functions as a storage element (latch) for storing binarized data.

In the binary conversion circuit of this AD converter 20, basically, the pulse signal, which is determined by the four T-type flip-flops FF221 to FF224 that form four bits and the selector 23, is transmitted to the first ripple counter section 25 via the first conversion circuit 24.

The pulse signal ESCK0 formed by the first ripple counter section 24 is transmitted to the second conversion circuit 27, and the upper bit is counted by the second ripple counter section 28.

In this binary conversion circuit, for example, a 4-bit BCD code is expressed by eight states 1000, 1100, 1110, 1111, 0111, 0011, 0001, and 0000.

In this case, when the most significant bit (MSB) is "1," the MSB is converted to "0." When the MSB is "0," the MSB is converted to "4."

When a lower bit other than the MSB is "0," the lower bit is converted to "0" as it is. When the lower bit is "1," the lower bit is converted to "1" as it is.

Then, the BCD code values of new eight states which are formed from the initial eight states are added, and the respective decimal numbers obtained by the addition ranging between 0 and 7 are used as the number of pulses.

FIG. 7 is a timing chart showing the operation of the AD converter shown in FIG. 6.

FIG. 8 is a diagram showing the correspondence between an extension code and a count value.

Figure 9A:
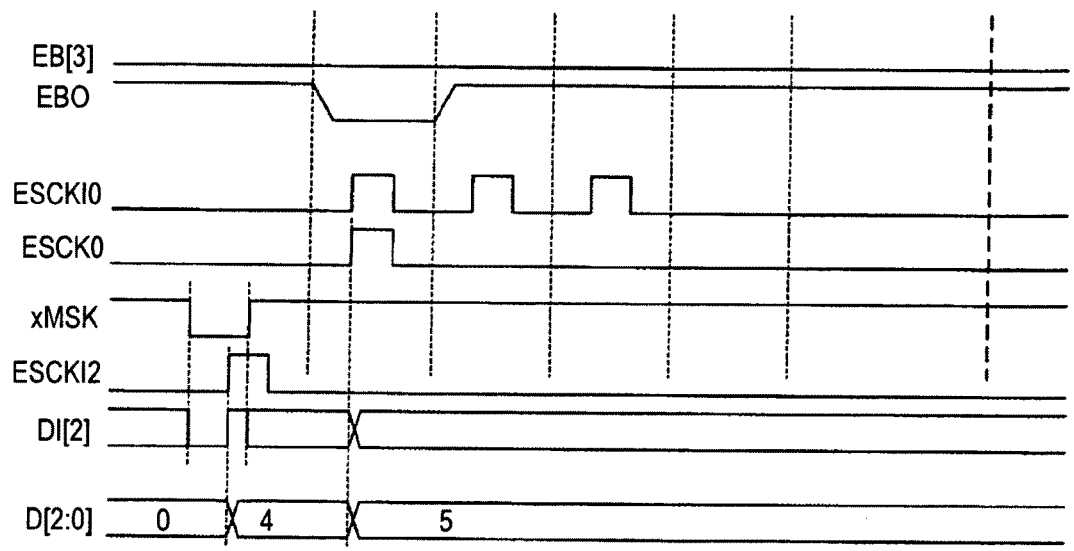
FIGS. 9A and 9B are timing charts showing the operation of the AD converter shown in FIG. 6, showing the operation state corresponding to the latched information of a latch circuit.
Figure 9B:
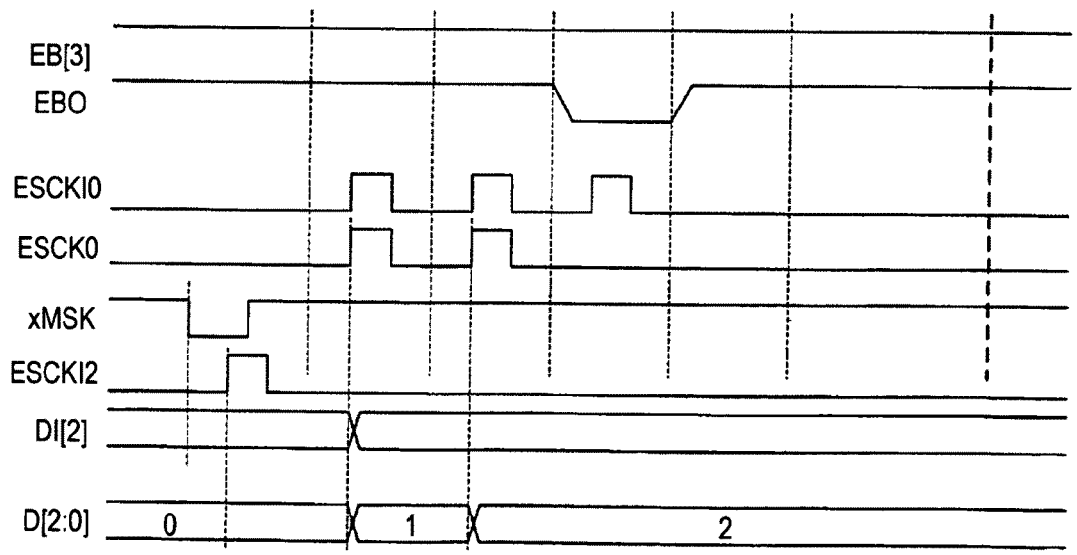

FIGS. 9A and 9B are timing charts showing the operation of the AD converter shown in FIG. 6. Specifically, FIG. 9A shows the operation state when an extension code EB[3:0] of the latch circuit is [0011b], and FIG. 9B shows the operation state when the extension code EB[3:0] of the latch circuit is [1110b].

Hereinafter, the operation of the AD converter 20 will be described in detail in connection with FIG. 7 to FIGS. 9A and 9B based on the processing of the binary conversion circuit.

In FIG. 7, a case where the phases of four clock signals are shifted by ⅛ Tck (where Tck is a clock cycle) is shown.

By a combination of 0 and 1 of the four clock signals ECK[0] to ECK[3], the clock cycle is evenly divided into 8 sub-periods. The clock signal ECK[3:0] is 1000b in the first period between 0 and ⅛ Tck and is 1100b in the subsequent period between ⅛ Tck and ⅔ Tck.

By dividing the phase of the clock signal by 8, it is possible to obtain information corresponding to a 3-bit binary code.

The clock signal ECK[3:0] is latched at an instant when the output signal VCO of the comparator 21 changes from a high level (H) to a low level (L), the latched data are used as the extension code EB[3:0] as described above.

When the first period between 0 and ⅛ Tck of the clock cycle is converted to a count value of "0," the subsequent period between ⅛ Tck and ⅔ Tck is converted to a count value of "1," and the next periods are converted to count values of 2, 3, 4, and so on, a number of pulses having the correspondence as shown in FIG. 8 are generated.

That is to say, when the extension code EB[3]=1, the number of "1" bits in the extension code EB[2:0] corresponds to the count value. When the extension code EB[3]=0, a number obtained by adding 4 to the number of "0" bits in the extension code EB[2:0] corresponds to the count value.

In the circuit shown in FIG. 6, the count pulse supplied to D[2], which is the output of the second ripple counter section 28, is generated when the extension code EB[3]=0.

In the first ripple counter section 25, if the extension code EB[3]=0, the count pulse supplied to D[0] is generated when the extension code EB[2:0] is "0."

In the first ripple counter section 25, if the extension code EB[3]=1, the count pulse supplied to D[0] is generated when the extension code EB[2:0] is "1."

Next, the operation of the AD converter shown in FIG. 6 will be described in connection with FIG. 4 and FIGS. 9A and 9B.

In the comparator 21, the reference voltage Vramp having a ramp waveform whose voltage value varies linearly with time is compared with the input voltage VSL, and the output signal VCO having a level corresponding to the comparison result is input to the latch circuit 22.

Moreover, the mask signal xMSK is set to a low level so that a carry signal from the signal D[1] of the first ripple counter section 25 to the signal D[2] of the second ripple counter section 28 is masked.

Next, when the pulse signal ESCKI2 is supplied to the second conversion circuit 27, a pulse is supplied to the signal D[2] if the extension code EB[3]=0, and the signal D[2] becomes "+4." In this case, if the extension code EB[3]=1, no pulse is supplied to the signal D[2], and the signal D[2] becomes "+0."

Next, the mask signal xMSK is set to a high level so that a carry signal from the output signal D[1] of the first ripple counter section 25 to the signal D[2] of the second ripple counter section 28 is allowed to pass.

Next, the pulse signal ESCKI0 is supplied to the first conversion circuit 24. In this case, whether or not the pulse of the pulse signal ESCKI0 will be supplied to the signal D[0] is determined by the logical values of the extension codes EB[3] and EB[n] (where n=0, 1, and 2).

The extension code EB[n] is sequentially selected by the select signal ESEL, and the count clock ESCK0 is transmitted to the first ripple counter section 25 only when EB[3]=EB[n].

Therefore, since the AD converter according to the second embodiment is configured by adding only several gates, but not more than 10, in seven storage elements (memory elements, flip-flops) in total, which the number is a minimum necessary number, the circuit size is very small in principle.

Since the binarized values are held in the ripple counters, it is possible to provide good compatibility with a digital CDS operation of a column ADC circuit.

The AD converter according to the second embodiment can be applied not only to a counter circuit of an image sensor, but also to a general circuit that converts phase information of other clocks to a binary code.

3. Third Embodiment

Third Exemplary Configuration of AD Converter

Figure 10:
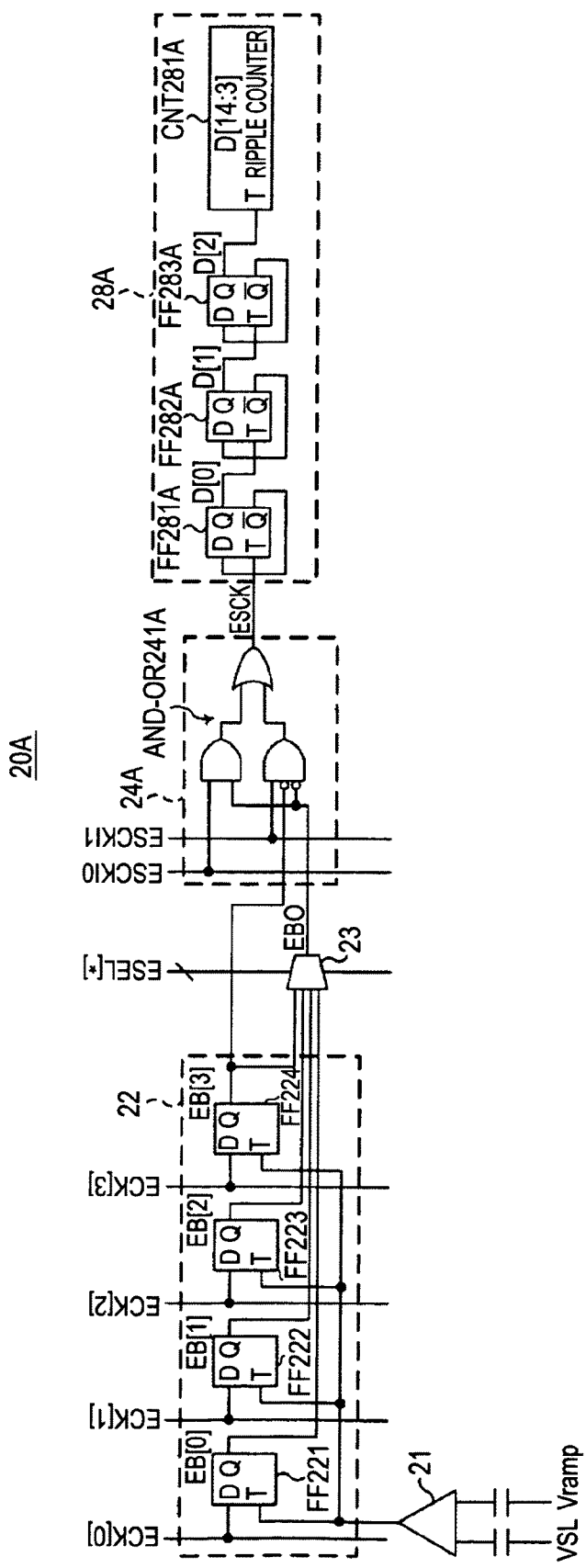
FIG. 10 is a diagram showing an exemplary configuration of an AD converter according to a third embodiment of the present invention.

FIG. 10 is a diagram showing an exemplary configuration of an AD converter according to the third embodiment of the present invention.

In the third embodiment, a case where a multi-phase clock signal is latched will be described.

This AD converter 20A according to the third embodiment is different from the AD converter 20 according to the second embodiment in the following respects.

The AD converter 20A of the third embodiment is different from the AD converter 20 of the second embodiment in terms of the count value. That is, the first period between 0 and ⅛ Tck of the clock cycle is converted to a count value of "1," the subsequent period between ⅛ Tck and ⅔ Tck is converted to a count value of "2," and the next periods are converted to count values of 3, 4, 5, and so on, In the circuit configuration, one conversion circuit 24A is disposed at the succeeding stage of the latch circuit 22 and the selector 23, and a ripple counter section 28A is disposed at an output terminal of the conversion circuit 24A.

The conversion circuit 24A converts the extension codes EB[0] to EB[3], which are the latched information of the latch circuit 22, to a pulse (train) in response to two pulse signals ESCKI0 and ESCKI1 and outputs the pulse signal ESCK to the ripple counter section 28A as a count clock.

The conversion circuit 24A has an AND-OR gate AOR241A.

A first 2-input AND gate of the AND-OR gate AOR241A has a first input terminal connected to a supply line of the pulse signal ESCKI0, and a second input terminal connected to the supply line of the signal EB0 of the selector 23.

A 3-input AND gate of the AND-OR gate AOR241A has a first input terminal connected to the supply line of the pulse signal ESCKI1, a second negative input terminal connected to the output line of the extension code EB[3], and the third negative input terminal connected to the supply line of the signal EB0 of the selector 23.

The ripple counter section 28A converts the phase information of the clock signal to a binary code as the lower and upper bits of the ripple counter in response to the count clock of the conversion circuit 24A.

The ripple counter section 28A has flip-flops FF281A to FF283A and a ripple counter CNT281A.

The flip-flop FF281A has an input D connected to its inverted output /Q (where "/" represents inversion), a terminal T connected to a supply line of the output signal ESCK of the conversion circuit 24A, and an output Q connected to a terminal T of the flip-flop FF282A.

The flip-flop FF282A has an input D connected to its inverted output /Q and an output Q connected to a terminal. T of the flip-flop FF283A.

The flip-flop FF283A has an input D connected to its inverted output /Q and an output Q connected to an input terminal of the ripple counter CNT281A.

The flip-flop FF281A functions as a storage element (latch) for storing binarized data.

In the binary conversion circuit of this AD converter 20, basically, the pulse signal, which is determined by the four T-type flip-flops FF221 to FF224 that form four bits and the selector 23, is transmitted to the ripple counter section 28A via the conversion circuit 24A.

The lower and upper bits are counted by the ripple counter section 28A.

In this binary conversion circuit, for example, a 4-bit BCD code is expressed by eight states 1000, 1100, 1110, 1111, 0111, 0011, 0001, and 0000.

In this case, when the most significant bit (MSB) is "1," the MSB is converted to "1" as it is. When the MSB is "0," the MSB is converted to "2."

When a lower bit other than the MSB is "0," the lower bit is converted to "0" as it is. When the lower bit is "1," the lower bit is converted to "1" as it is.

Then, the BCD code values of new eight states which are formed from the initial eight states are added, and the respective decimal numbers obtained by the addition ranging between 1 and 8 are used as the number of pulses.

Figure 11:
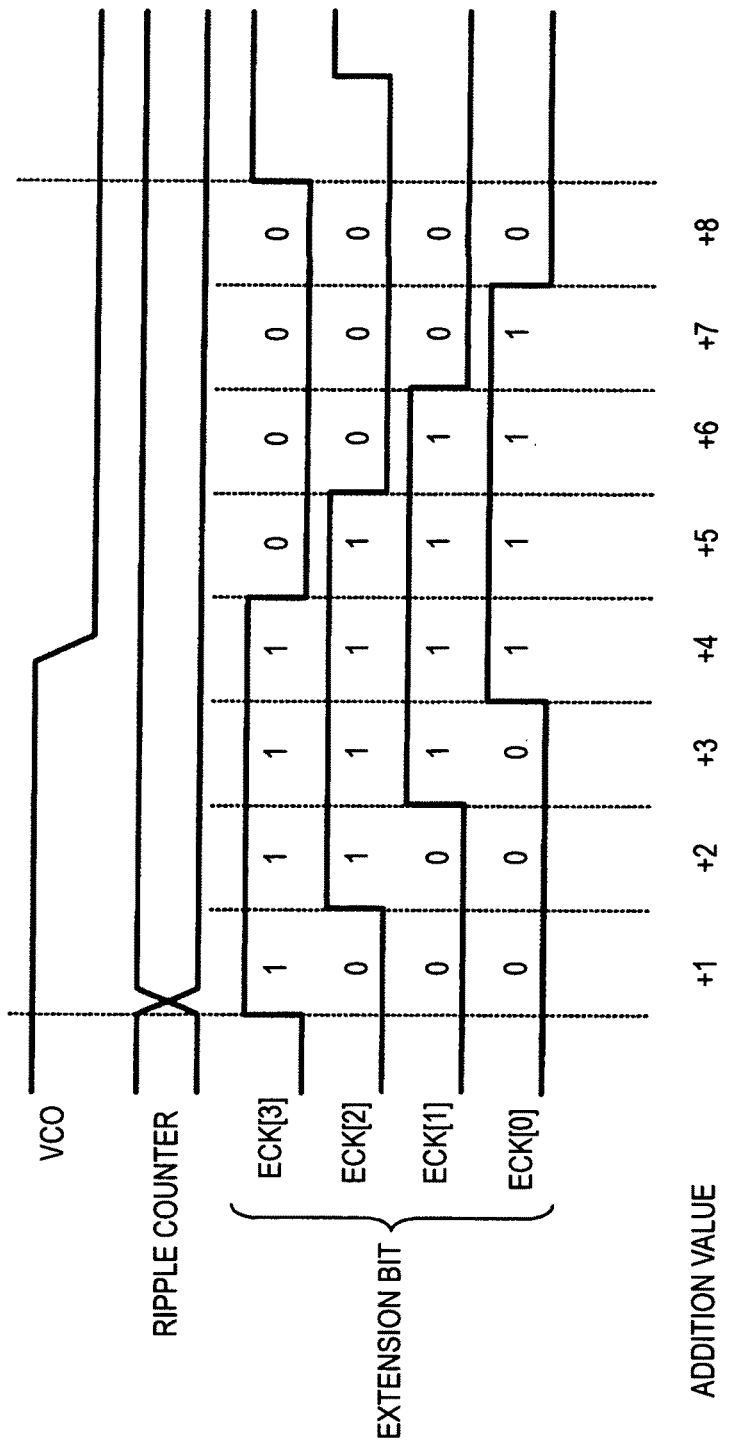
FIG. 11 is a timing chart showing the operation of the AD converter shown in FIG. 10.

FIG. 11 is a timing chart showing the operation of the AD converter shown in FIG. 10.

FIG. 12 is a diagram showing the correspondence between an extension code and a count value.

Figure 13A:
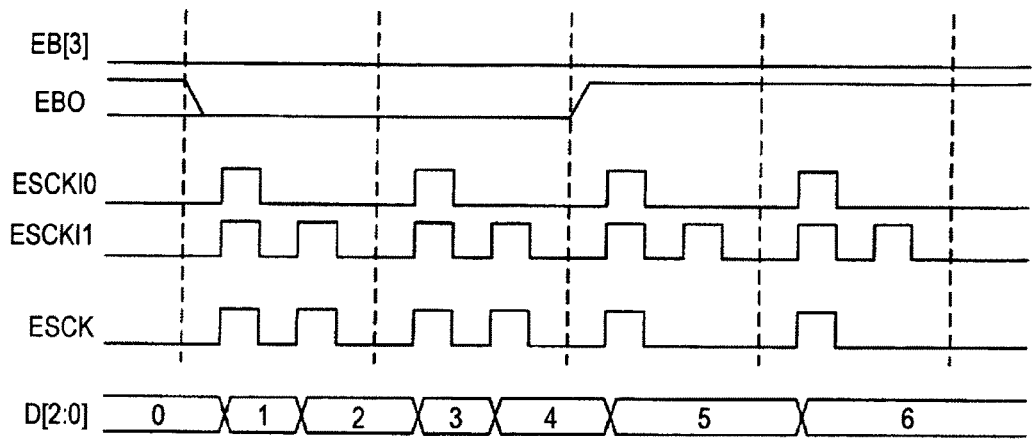
FIGS. 13A and 13B are timing charts showing the operation of the AD converter shown in FIG. 10, showing the operation state corresponding to the latched information of a latch circuit.
Figure 13B:
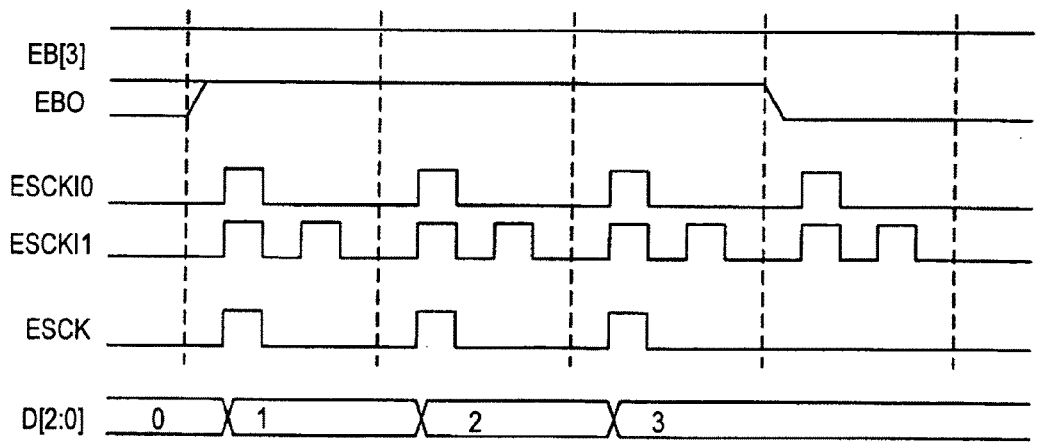

FIGS. 13A and 13B are timing charts showing the operation of the AD converter shown in FIG. 10. Specifically, FIG. 13A shows the operation state when an extension code EB[3:0] of the latch circuit is [0011b], and FIG. 13B shows the operation state when the extension code EB[3:0] of the latch circuit is [1110b].

Hereinafter, the operation of the AD converter 20 will be described in detail in connection with FIG. 11 to FIGS. 13A and 13B based on the processing of the binary conversion circuit.

In FIG. 11, a case where the phases of four clock signals are shifted by ⅛ Tck (where Tck is a clock cycle) is shown.

In the third embodiment, the count value is added by 1 to the count value used in the second embodiment. Although there is an offset, it may not cause any particular problem in implementation.

In this case, as shown in FIG. 12, the count clock supplied to D[0] (flip-flop FF281A) may be generated by the following rules.

That is to say, when each bit of the extension bit EB[2:0] is 1, one count clock is always generated.

When each bit of the extension bit EB[2:0] is 0, the following rules are applied.

When the extension bit EB[3]=1, no count clock is generated.

When the extension bit EB[3]=0, two count clocks are generated if each bit of the extension bit EB[2:0] is 0.

In response to the select signal ESEL, the extension codes EB[n] (where n=0, 1, and 2) are sequentially selected by the selector 23.

Moreover, by a combination of the extension bits EB[3] and EB[n], for each n, whether either of the pulse signal ESCKI0 with one pulse or the pulse signal ESCKI1 with two pulses will be used as the count clock to be supplied to D[0] or no count operation will be performed is controlled by the conversion circuit 24A.

According to the third embodiment, the circuit configuration can be made simpler than that of the second embodiment. However, on the other hand, the time required for binary conversion may be extended.

4. Fourth Embodiment

Fourth Exemplary Configuration of AD Converter

In the fourth embodiment, an example where the AD converters according to the second and third embodiments are implemented as a TDC (Time-to-Digital Converter) will be described.

FIG. 14 is a timing chart according to the fourth embodiment.

Figures 15A, 15B:
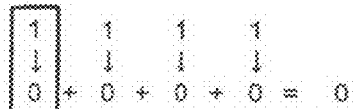
FIGS. 15A and 15B are diagrams showing the correspondence between an extension code and a binary code according to the fourth embodiment.

FIGS. 15A and 15B are diagrams showing the correspondence between an extension code and a binary code according to the fourth embodiment. FIG. 15A shows the case corresponding to the second embodiment, and FIG. 15B shows the case corresponding to the third embodiment.

Figure 16:
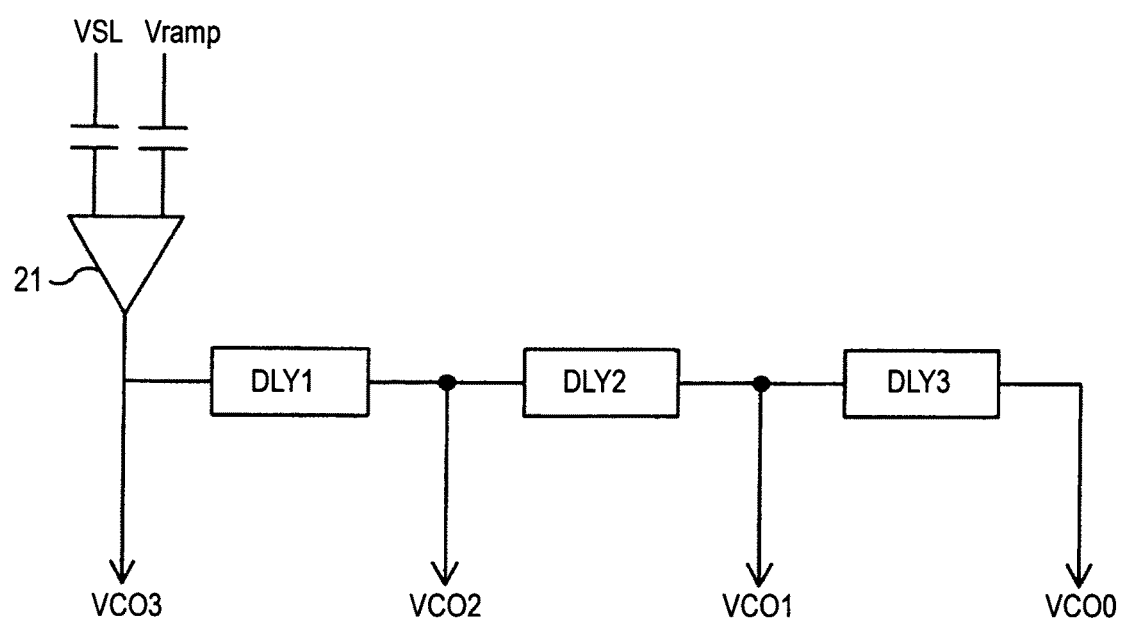
FIG. 16 is a diagram showing a delay section for delaying an output signal VCO of a comparator according to the fourth embodiment.

FIG. 16 is a diagram showing a delay section for delaying an output signal VCO of a comparator according to the fourth embodiment.

The delay sections DLY1, DLY2, and DLY3 in FIG. 16 each delay the signal VCO by an amount of Tck/8.

In the second embodiment, a multi-phase clock signal is latched by the output signal VCO of the same comparator 11. However, in the fourth embodiment, the signal VCO is delayed by an amount of Tck/8 (VCO[3:0]) and the same clock signal CK is latched.

When clock information latched by the signal VCO[n] is an extension code EB[n], the extension code EB[3:0] and a corresponding binary code have the relationships as shown in FIG. 15A or 15B.

The shown relationships are only bit-inverted versions of those of the second and third embodiments, where 0-bits are inverted to 1-bits. Therefore, it may be obvious that by inserting a logical inverter circuit, it is possible to obtain the same binary codes as those of the second and third embodiments.

5. Fifth Embodiment

Fifth Exemplary Configuration of AD Converter

Figure 17:
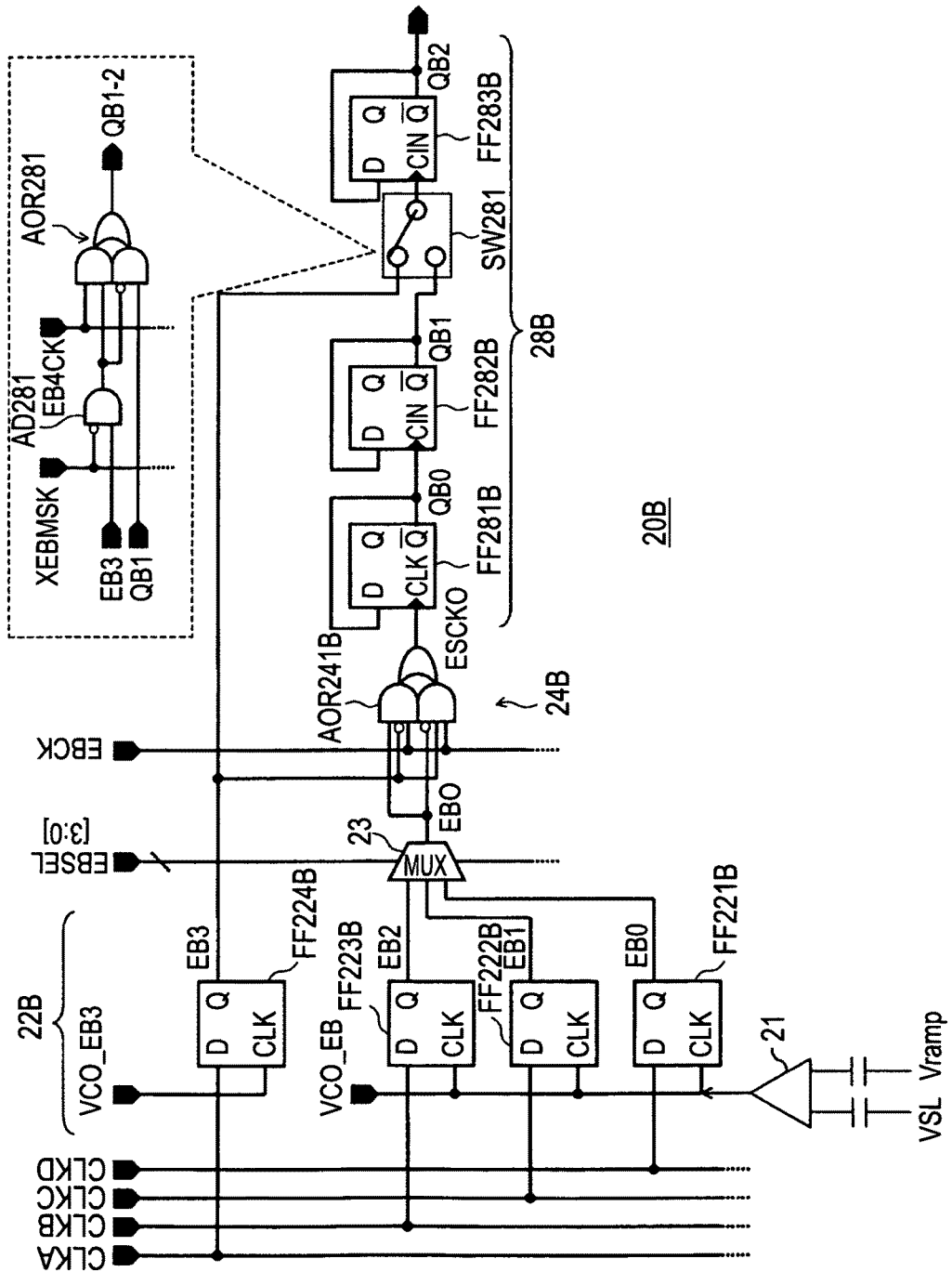
FIG. 17 is a diagram showing an exemplary configuration of an AD converter according to a fifth embodiment of the present invention.

FIG. 17 is a diagram showing an exemplary configuration of an AD converter according to the fifth embodiment of the present invention.

In the fifth embodiment, a case where a multi-phase clock signal is latched will be described.

This AD converter 20B according to the fifth embodiment is different from the AD converter 20 according to the second embodiment in the following respects.

In a latch circuit 22B, plural (three in this case) flip-flops FF221B to FF223B serving as a first latch are used for latching clock signals CLKB, CLKC, and CLKD in synchronism with the output signal VCO_EB of the comparator 21 to obtain extension codes EB[2], EB[1], and EB[0].

Moreover, one flip-flop FF224B serving as a second latch latches a clock signal CLKA in synchronism with a signal VCO_EB3 different from the output of the comparator 21 to obtain an extension code EB[3].

Basically, the latch circuit 22B latches phase information of a plurality of clock signals having different phases including the main clock CLKA at the time when the output signal VCO of the comparator 21 is inverted, and decodes the latched value, thus outputting a lower bit having a higher resolution than the clock cycle.

In this example, as the plurality of clock signals having different phases, the clock signals CLKA, CLKB, CLBC, and CLKD are used. The clock signals CLKB, CLKC, and CLKD have respective phases which are sequentially shifted by 45° from the phase of the main clock signal CLKA.

A selector 23B sequentially selects the extension codes EB[2], EB[1], and EB[0] in response to a select signal EBSEL [3:0] and outputs the selected extension code to a conversion circuit 24B.

In the fifth embodiment, one conversion circuit 24B is disposed at the succeeding stage of the latch circuit 22B and the selector 23B, and a ripple counter section 28B is disposed at an output terminal of the conversion circuit 24B.

The conversion circuit 24B converts the extension codes EB[0] to EB[3], which are the latched information of the latch circuit 22B, to a pulse (train) in response to one pulse signal EBCK and outputs the pulse signal ESCK0 to the ripple counter section 28B as a count clock.

The conversion circuit 24B has an AND-OR gate AOR241B.

A first 3-input AND gate of the AND-OR gate AOR241B has a first input terminal connected to a supply line of the pulse signal EBCK, a second negative input terminal connected to the supply line of the extension bit EB[3], and a third input terminal connected to the supply line of the signal EB0 of the selector 23B.

A second 3-input AND gate of the AND-OR gate AOR241B has a first input terminal connected to the supply line of the pulse signal EBCK, a second input terminal connected to the supply line of the extension bit EB[3], and a third negative input terminal connected to the supply line of the signal EB0 of the selector 23B.

The ripple counter section 28B converts the phase information of the clock signal to a binary code as the lower and upper bits of the ripple counter in response to the count clock of the conversion circuit 24B.

The ripple counter section 28B has flip-flops FF281B to FF283B, a switch SW281, and a ripple counter (not shown).

The flip-flop FF281B has an input D connected to its inverted output /Q (where "/" represents inversion), a terminal CIN connected to a supply line of the output signal ESCK0 of the conversion circuit 24B, and an inverted output /Q connected to a terminal CIN of the flip-flop FF282A. The flip-flop FF281B outputs a signal QB0 from the inverted output /Q.

The flip-flop FF282B has an input D connected to its inverted output /Q and an inverted output /Q connected to a terminal a of the switch SW281. The flip-flop FF282B outputs a signal QB1 from the inverted output /Q.

The switch SW281 has a terminal b connected to the supply line of the extension code EB[3] and a terminal a connected to a terminal CIN of the flip-flop FF283B.

Moreover, the flip-flop FF283B has an input D connected to its inverted output /Q and outputs a signal QB2 from the inverted output /Q.

As shown in FIG. 17, the switch SW281 has an AND gate AD281 and an AND-OR gate AOR281.

The AND gate AD281 has a first negative input terminal connected to a supply line of a mask signal XEBMSK and a second input terminal connected to the supply line of the extension code EB[3].

A first 2-input AND gate of the AND-OR gate AOR281 has a first input terminal connected to a supply line of a clock signal EB4CK and a second input terminal connected to an output terminal of the AND gate AD281.

A second 2-input AND gate of the AND-OR gate AOR281 has a first negative input terminal connected to the output terminal of the AND gate AD281 and a second input terminal connected to an output line of the signal QB1 of the flip-flop FF282B.

In the switch SW281, when the mask signal XEBMSK is at a low level, the extension code EB[3] is selected and supplied to the flip-flop FF283B.

When the mask signal XEBMSK is at a high level, the signal QB1 of the flip-flop FF282B is selected and supplied to the flip-flop FF283B.

In the binary conversion circuit of this AD converter 20B, basically, the pulse signal, which is determined by the four T-type flip-flops FF221B to FF224B that form four bits and the selector 23B, is transmitted to the ripple counter section 28B via the conversion circuit 24B.

The lower and upper bits are counted by the ripple counter section 28B.

Figure 18:
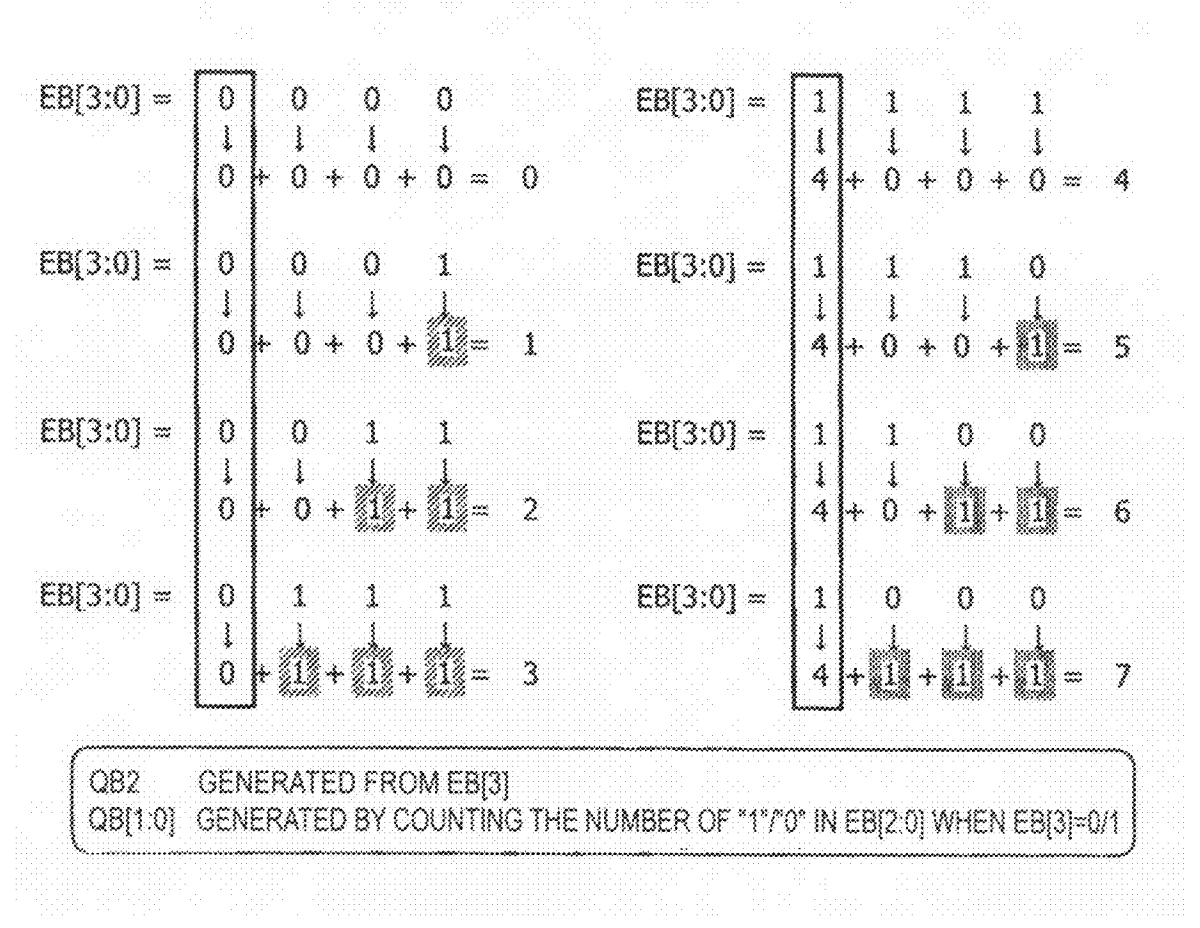

FIG. 18 is a diagram showing the correspondence between an extension code and a count value in the AD converter shown in FIG. 17.

In this binary conversion circuit, for example, a 4-bit BCD code is expressed by eight states 1000, 1100, 1110, 1111, 0111, 0011, 0001, and 0000.

In this case, when the most significant bit (MSB) is "0," the MSB is converted to "0" as it is. When a lower bit other than the MSB is "0," the lower bit is converted to "0" as it is. When the lower bit is "1," the lower bit is converted to "1" as it is.

When the most significant bit (MSB) is "1," the MSB is converted to "4." When a lower bit other than the MSB is "1," the lower bit is converted to "0." When the lower bit is "0," the lower bit is converted to "1."

Then, the BCD code values of new eight states which are formed from the initial eight states are added, and the respective decimal numbers obtained by the addition ranging between 0 and 7 are used as the number of pulses.

In the above-mentioned configuration, the signal QB2 is generated from the extension code EB[3].

The signal QB[1:0] is generated based on the number of "1"/"0" bits in the extension code EB[2:0] when EB[3]=0/1.

As described above, the AD converter according to the present embodiment includes a storage element (flip-flop) for latching the phase information of a clock signal, a minimum number of storage elements (flip-flops) necessary for holding corresponding binary codes, and several logic gates, and the number of storage elements coincides with the amount of information to be held.

That is to say, the AD converter of the present embodiment is characterized in that it is configured with a minimum necessary circuit scale.

Moreover, as described in the first and second embodiments, the AD converter can be applied regardless of how many points of the clock phase will be stored.

The embodiment of the present invention relates to a method for latching the phase information of a clock signal and supplying a pulse signal to the ripple counter in order to obtain a binary value corresponding to the phase information. As described in the second and third embodiments, there are various implementation forms applicable when latching the same multi-phase clock information. Moreover, the circuit dimension and the implementation form may be appropriately changed in accordance with its application, the logical easiness, and the like.

The embodiment of the present invention can be applied not only to an image sensor, but also to a general circuit that converts phase information of a clock signal to a binary code. The embodiment of the present invention is particularly useful for applications where there is a great limitation on a circuit dimension such as in a column circuit of an image sensor.

6. Sixth Embodiment

Exemplary Overall Configuration of Solid-State Imaging Device

Figure 19:
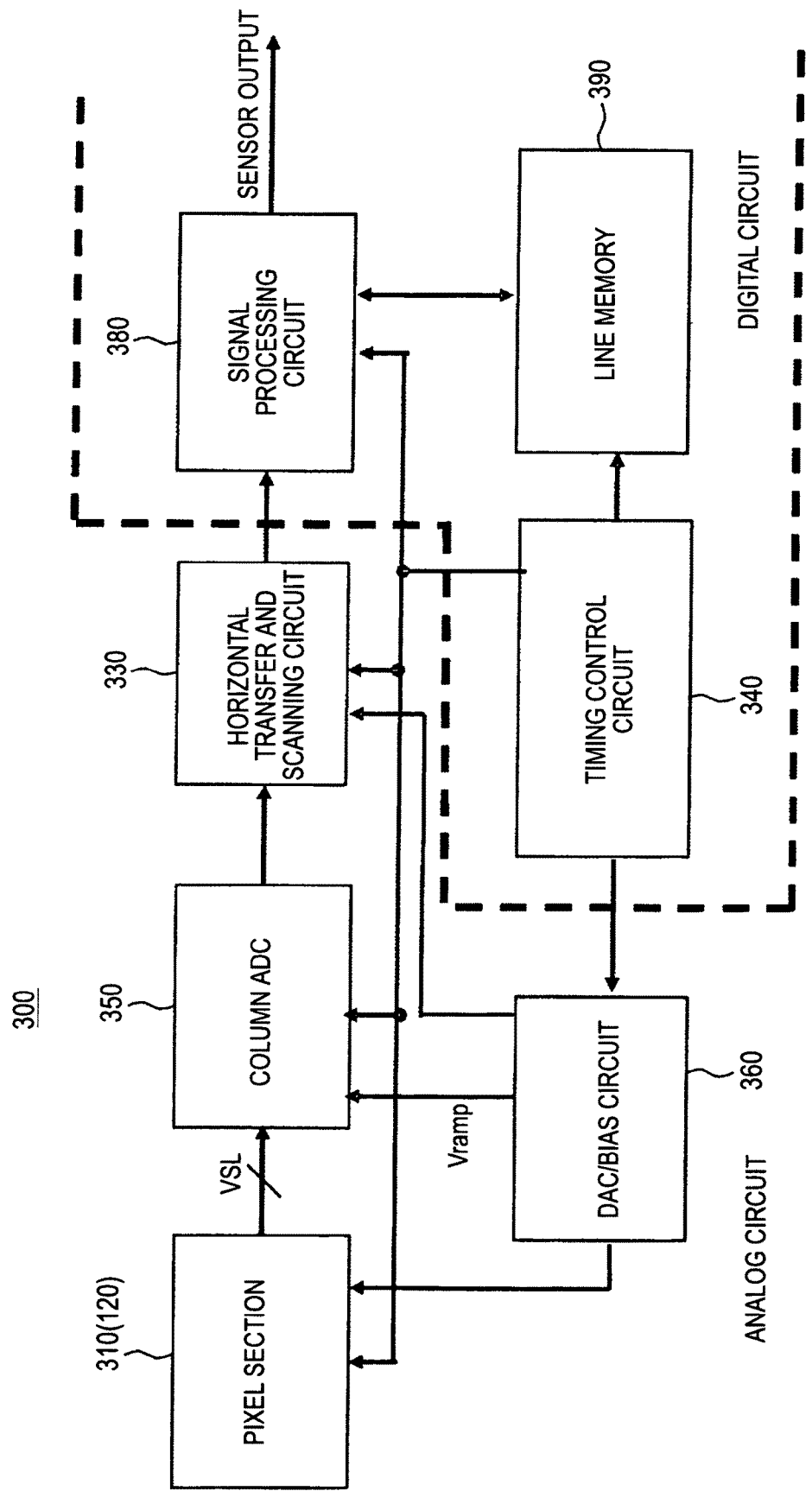
FIG. 19 is a block diagram showing an exemplary configuration of a solid-state imaging device (CMOS image sensor) employing a column-parallel ADC according to the embodiment of the present invention.

FIG. 19 is a block diagram showing an exemplary configuration of a solid-state imaging device (CMOS image sensor) employing a column-parallel ADC according to the fifth embodiment of the present invention.

Figure 20:
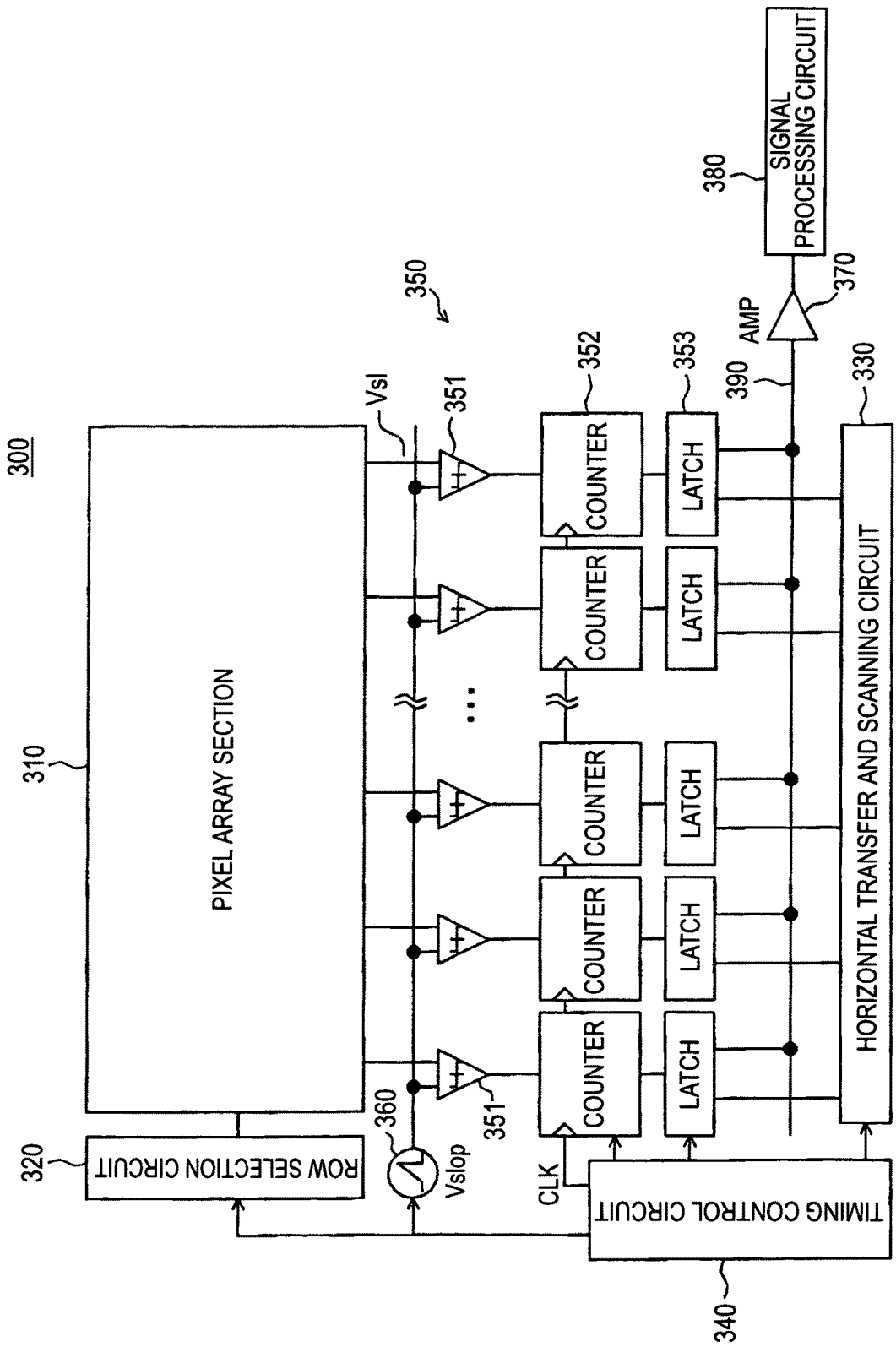
FIG. 20 is a block diagram showing more specifically an ADC group of the column-parallel ADC employed by the solid-state imaging device (CMOS image sensor) shown in FIG. 19.

FIG. 20 is a block diagram showing more specifically an ADC group of the column-parallel ADC employed by the solid-state imaging device (CMOS image sensor) shown in FIG. 19.

As shown in FIGS. 19 and 20, this solid-state imaging device 300 has a pixel section 310 serving as an imaging section, a vertical scanning circuit 320, a horizontal transfer scanning circuit 330, a timing control circuit 340, and an AD converter group (ADC) 350 serving as a pixel signal readout section. The pixel signal readout section is configured to include the vertical scanning circuit 320 and the like.

The solid-state imaging device 300 further has a DAC and bias circuit 360 including a DA converter 361, an amplifier circuit (S/A) 370, a signal processing circuit 380, and a line memory 390.

Among these constituent elements, the pixel section 310, the vertical scanning circuit 320, the horizontal transfer scanning circuit 330, the ADC group 350, the DAC and bias circuit 360, and the amplifier circuit (S/A) 370 are configured by analog circuits.

Moreover, the timing control circuit 340, the signal processing circuit 380, and the line memory 390 are configured by digital circuits.

The pixel section 310 has a configuration in which pixels, each including a photodiode and an intra-pixel amplifier, are arranged in a matrix form.

Figure 21:
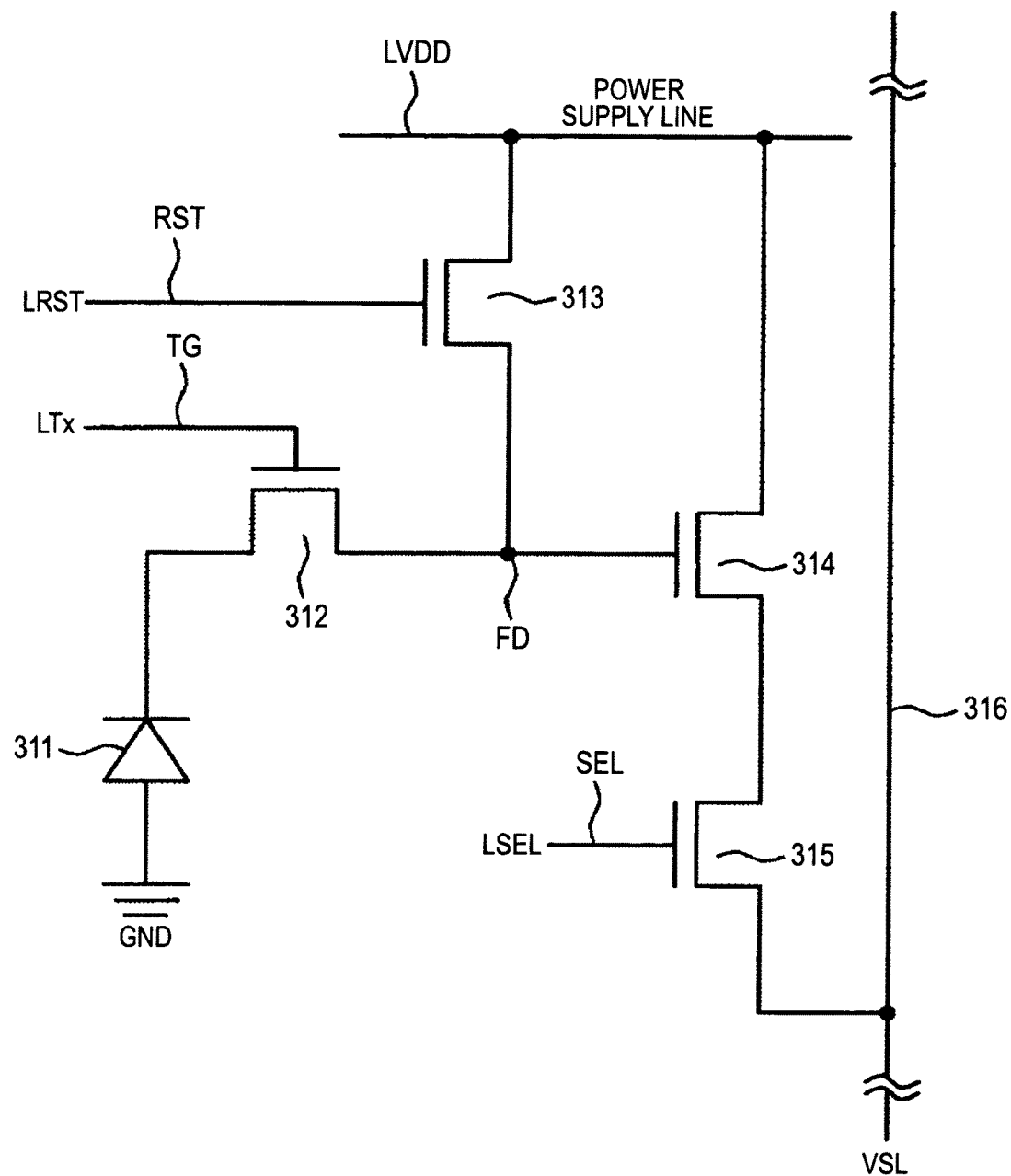
FIG. 21 is a diagram showing an example of a pixel in a CMOS image sensor, the pixel having four transistors according to the embodiment of the present invention.

FIG. 21 is a diagram showing an example of a pixel in a CMOS image sensor, the pixel having four transistors according to the embodiment of the present invention.

This pixel circuit 301A has a photodiode 311, for example, as a photoelectric conversion element.

The pixel circuit 301A has the photodiode 311 serving as one photoelectric conversion element.

The pixel circuit 301A has four transistors as active elements for one photodiode 311. The four transistors include a transfer transistor 312 serving as a transfer element, a reset transistor 313 serving as a reset element, an amplification transistor 314, and a selection transistor 315.

The photodiode 311 photoelectrically converts an incident light into an amount of electric charges (electrons in this case) corresponding to the amount of the incident light.

The transfer transistor 312 is connected between the photodiode 311 and a floating diffusion FD serving as an output node.

Upon application of a drive signal TG to the gate (transfer gate) of the transfer transistor 312 via a transfer control line LTx, the transfer transistor 312 transfers the electrons photoelectrically converted by the photodiode 311 to the floating diffusion FD.

The reset transistor 313 is connected to a power supply line LVDD and the floating diffusion FD.

Upon application of a reset signal RST to the gate of the reset transistor 313 via a reset control line LRST, the reset transistor 313 resets the potential of the floating diffusion FD to the potential of the power supply line LVDD.

A gate of the amplification transistor 314 is connected to the floating diffusion FD. The amplification transistor 314 is connected to a vertical signal line 316 via the selection transistor 315. The amplification transistor 314 and a constant current source located outside the pixel section constitute a source follower.

When a control signal (address signal or select signal) SEL is supplied to the gate of the selection transistor 315 via a select control line LSEL, the selection transistor 315 is turned on.

When the selection transistor 315 is turned on, the amplification transistor 314 amplifies the potential of the floating diffusion FD and outputs a voltage corresponding to the amplified potential to the vertical signal line 316. The voltage output from each pixel is then output to the ADC group 350 serving as a pixel signal readout circuit via the vertical signal line 316.

These operations are simultaneously performed for pixels of one row because the respective gates of, e.g., the transfer transistor 312, the reset transistor 313, and the selection transistors 315 are connected for each row.

A set of the reset control line LRST, the transfer control line LTx, and the select control line LSEL, which are provided in the pixel section 310, is provided for each row of a pixel array.

The reset control line LRST, the transfer control line LTx, and the select control line LSEL are driven by the vertical scanning circuit 320 serving as a pixel driving section.

In the solid-state imaging device 300, the timing control circuit 340 that generates an internal clock, the vertical scanning circuit 320 that controls row addressing and row scanning, and the horizontal transfer scanning circuit 330 that controls column addressing and column scanning are arranged as control circuits for sequentially reading out signals from the pixel section 310.

The timing control circuit 340 generates timing signals necessary for signal processing by the pixel section 310, the vertical scanning circuit 320, the horizontal transfer scanning circuit 330, the AD converter group (ADC group) 350, the DAC and bias circuit 360, the signal processing circuit 380, and the line memory 390.

In the pixel section 310, by performing photon accumulation and discharge using a line shutter, for example, moving or still images are photoelectrically converted in each pixel row, and an analog signal VSL is output to the ADC group.

In the ADC group 350, each ADC block (each column section) performs APGA-compatible integration ADC using a reference voltage Vramp supplied from the DA converter (DAC) 361 and digital CDS with respect to the analog output of the pixel section 310 to output a digital signal of several bits.

Figure 22:
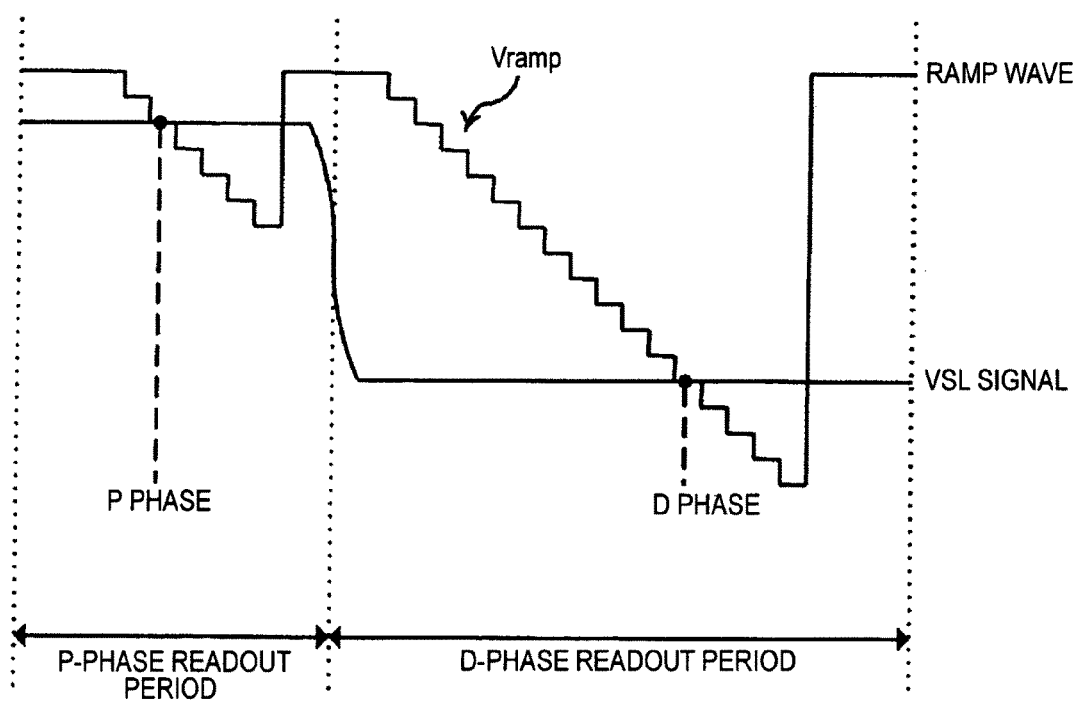
FIG. 22 is a diagram showing an example of a ramp waveform generated by the DA converter shown in FIGS. 19 and 20 and the operation timing of ADC.

FIG. 22 is a diagram showing an example of a ramp waveform generated by the DAC shown in FIGS. 19 and 20 and the operation timing of ADC.

In the ADC group 350, ADCs are disposed at a plurality of columns.

The DA converter 361 generates a reference voltage Vramp having a ramp waveform (RAMP) obtained by stepwise changing a reference voltage, as shown in FIG. 22.

Each ADC has a comparator 351 that compares an analog signal (potential VSL) obtained from pixel in each row line via the vertical signal line 316 with the reference voltage Vramp.

In addition, each ADC has a counter 352 that counts a comparison time and a latch (memory) 353 that holds a count result.

As the comparator 351 and the counter 352, the same configurations as for the AD converter according to the first to fifth embodiments, for example, may be employed.

Therefore, description thereof will be omitted herein.

The ADC group 350 has a k-bit digital signal conversion function and is disposed for each vertical signal line (column line), whereby a column-parallel ADC block is formed.

The output of each latch 353 is connected to a horizontal transfer line LTRF having, for example, a k-bit width.

In addition, k amplifier circuits 370 corresponding to the horizontal transfer line LTRF and the signal processing circuit 380 are arranged.

After completion of an AD conversion period in the ADC group 350, the horizontal transfer scanning circuit 330 transfers data held in the latches 353 to the horizontal transfer line LTRF to be input to the signal processing circuit 380 via the amplifier circuit 370, and a two-dimensional image is generated by predetermined signal processing.

The horizontal transfer scanning circuit 330 performs concurrent parallel transfer of several channels in order to ensure a transfer rate.

The timing control circuit 340 generates timing signals necessary for signal processing by respective blocks such as the pixel section 310 and the ADC group 350.

The signal processing circuit 380 at the succeeding stage performs digital signal processing for the signal stored in the line memory 390. This digital signal processing includes correction of vertical line defects and point defects, signal clamping, parallel-serial conversion, compression, encoding, addition, averaging, intermittent operation and the like.

The line memory 390 stores digital signals transmitted from each pixel row.

In the solid-state imaging device 300 of the present embodiment, a digital output of the signal processing circuit 380 is transmitted as an input to an ISP and a baseband LSI.

The column-parallel output processing is performed as described above.

The CMOS image sensor 300 which is the solid-state imaging device according to the sixth embodiment of the present invention employs any one of the AD converters (ADCs) 10, 20, 20A, and 20B according to the first to fourth embodiments.

Therefore, since this solid-state imaging device is configured by adding only several gates, but not more than 10, in seven storage elements (memory elements, flip-flops) in total, which is the minimum necessary number, the circuit size is very small in principle.

Since the binarized values are held in the ripple counters, it is possible to provide good compatibility with a digital CDS operation of a column ADC circuit.

The sixth embodiment can be applied not only to a counter circuit of an image sensor, but also to a general circuit that converts phase information of other clocks to a binary code.

The solid-state imaging device having the above-described advantages can be used as imaging devices for digital cameras and video cameras.

7. Seventh Embodiment

Exemplary Configuration of Camera System

Figure 23:
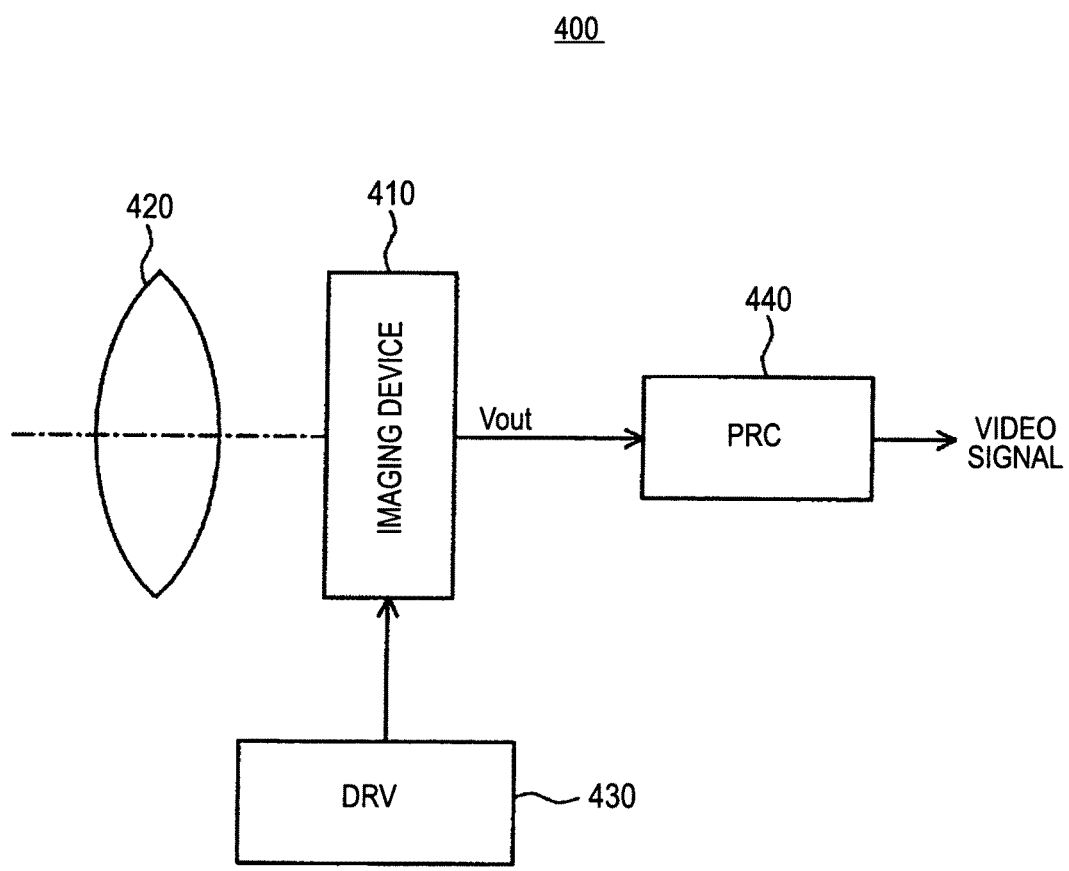
FIG. 23 is a diagram showing an exemplary configuration of a camera system to which a solid-state imaging device according to the embodiment of the present invention is applied.

FIG. 23 is a diagram showing an exemplary configuration of a camera system to which a solid-state imaging device according to the seventh embodiment of the present invention is applied.

As shown in FIG. 23, this camera system 400 has an imaging device 410 to which the solid-state imaging device 300 according to the embodiment of the present invention can be applied.

The camera system 400 has a lens 420 that forms an image of incident light (image light) on an imaging surface, for example, as an optical system that guides incident light to a pixel area of the imaging device 410 (i.e., forms an image of a subject).

The camera system 400 further has a driver circuit (DRV) 430 that drives the imaging device 410 and a signal processing circuit (PRC) 440 that processes an output signal of the imaging device 410.

The drive circuit 430 has a timing generator (not shown) that generates various timing signals, including a start pulse and a clock pulse, for driving the circuits in the imaging device 410, and drives the imaging device 410 by using a predetermined timing signal.

The signal processing circuit 440 performs predetermined signal processing on the output signal of the imaging device 410.

An image signal processed by the signal processing circuit 440 is recorded in a recording medium, for example, a memory. The image information recorded in the recording medium is printed on paper as a hardcopy by a printer or the like. Moreover, the image signal processed by the signal processing circuit 440 is displayed as a moving image on a monitor including a liquid crystal display or the like.

As described above, by mounting the solid-state imaging device 300 as the imaging device 410 on the imaging apparatus such as a digital still camera, it is possible to achieve a high-accuracy camera.

The present application contains subject matter related to that disclosed in Japanese Priority Patent Application JP 2009-106961 filed in the Japan Patent Office on Apr. 24, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A binary conversion circuit comprising:
a latch circuit that latches phase information of at least one clock signal when the level of a signal is inverted, the level of the signal being inverted based on its state;
at least one conversion circuit that converts the latched phase information of the latch circuit to a pulse train in response to a pulse signal; and
a ripple counter section that converts phase information of a clock to a binary code by using the pulse obtained by the conversion of the conversion circuit as a count clock,
wherein the conversion circuit includes a first conversion circuit and a second conversion circuit,
wherein the ripple counter section includes a first ripple counter section and a second ripple counter section,
wherein the latch circuit includes four T-type flip-flops that latch different four clock signals, respectively, in which three consecutive T-type flip-flops form a first latch, and a remaining one of the four T-type flip-flops forms a second latch,
wherein the binary conversion circuit further includes
a selector that selects latched phase information of the three T-type flip-flops serving as the first latch of the latch circuit in response to a select signal, and
a mask circuit that performs mask processing for determining whether or not latched phase information of the T-type flip-flop serving as the second latch of the latch circuit will be input to the second conversion circuit in response to a mask signal,
wherein the first conversion circuit converts the four pieces of latched phase information of the latch circuit to a pulse train in response to a first pulse signal and outputs the converted signal as a count clock of the first ripple counter section; and
wherein the second conversion circuit converts an output signal of the first ripple counter section or the latched phase information of the T-type flip-flop serving as the second latch, supplied via the mask circuit, to a count clock in response to a second pulse signal and outputs the count clock to the second ripple counter section that counts an upper bit.

2. The binary conversion circuit according to claim 1, wherein when a 4-bit BCD code is expressed by eight states 1000, 1100, 1110, 1111, 0111, 0011, 0001, and 0000, new eight states are formed from the initial eight states in such a way that most significant bit (MSB) values "1" and "0" are converted to "0" and "4," respectively, and lower bit values "0" and "1" other than the MSB are converted to "0" and "1," respectively, as they are, and BCD code values of the new eight states are added to obtain decimal numbers ranging between 0 to 7, the decimal numbers being used as the number of pulses.

3. A binary conversion circuit comprising:
a latch circuit that latches phase information of at least one clock signal when the level of a signal is inverted, the level of the signal being inverted based on its state;
at least one conversion circuit that converts the latched phase information of the latch circuit to a pulse train in response to a pulse signal; and
a ripple counter section that converts phase information of a clock to a binary code by using the pulse obtained by the conversion of the conversion circuit as a count clock,
wherein the latch circuit includes four T-type flip-flops that latch different four clock signals, respectively, in which three consecutive T-type flip-flops form a first latch, and a remaining one of the four T-type flip-flops forms a second latch,
wherein the binary conversion circuit further includes a selector that selects latched phase information of the three T-type flip-flops serving as the first latch of the latch circuit in response to a select signal, and
wherein the first conversion circuit converts the four pieces of latched phase information of the latch circuit to a pulse train in response to first and second pulse signals and outputs the converted signal as a count clock of the ripple counter section.

4. The binary conversion circuit according to claim 3, wherein when a 4-bit BCD code is expressed by eight states 1000, 1100, 1110, 1111, 0111, 0011, 0001, and 0000, new eight states are formed from the initial eight states in such a way that most significant bit (MSB) values "1" and "0" are converted to "1" and "2," respectively, and lower bit values "0" and "1" other than the MSB are converted to "0" and "1," respectively, as they are, and BCD code values of the new eight states are added to obtain decimal numbers ranging between 1 to 8, the decimal numbers being used as the number of pulses.

5. A binary conversion method comprising the steps of:
latching phase information of at least one clock signal when the level of a signal is inverted, the level of the signal being inverted based on its state;
converting the latched phase information to a pulse train in response to a pulse signal; and
converting the phase information to a binary value by using the pulse obtained by the conversion as a count clock of the ripple counter section, wherein when a 4-bit BCD code is expressed by eight states 1000, 1100, 1110, 1111, 0111, 0011, 0001, and 0000, new eight states are formed from the initial eight states in such a way that most significant bit (MSB) values "1" and "0" are converted to "0" and "4," respectively, and lower bit values "0" and "1" other than the MSB are converted to "0" and "1," respectively, as they are, and BCD code values of the new eight states are added to obtain decimal numbers ranging between 0 to 7, the decimal numbers being used as the number of pulses, or wherein when a 4-bit BCD code is expressed by eight states 1000, 1100, 1110, 1111, 0111, 0011, 0001, and 0000, new eight states are formed from the initial eight states in such a way that most significant bit (MSB) values "1" and "0" are converted to "1" and "2," respectively, and lower bit values "0" and "1" other than the MSB are converted to "0" and "1," respectively, as they are, and BCD code values of the new eight states are added to obtain decimal numbers ranging between 1 to 8, the decimal numbers being used as the number of pulses.

6. A binary conversion circuit comprising:
a latch circuit configured to receive a clock signal and an output signal, and latch phase information of the clock signal when a level of the output signal is inverted;
a conversion circuit configured to receive the latched phase information from the latch circuit and a pulse signal, and convert the latched phase information to a pulse train in response to the pulse signal; and
a ripple counter section configured to receive the pulse train as a count clock and convert the phase information of the clock signal to a binary code by using the pulse train as a count clock,
wherein the ripple counter section includes an upper-bit ripple counter section and a lower-bit ripple counter section,
wherein the upper-bit ripple counter section performs a count operation in response to the clock signal, and
wherein the lower-bit ripple counter section performs a count operation based on the phase information of the clock.

7. The binary conversion circuit according to claim 6, wherein the conversion circuit converts the latched phase information to a plurality of pulse trains corresponding to a corresponding binary code.

8. The binary conversion circuit according to claim 6,
wherein the latch circuit latches phase information of one clock at a plurality of timings, and
wherein the conversion circuit converts the latched phase information of each of the timings to a pulse train.

9. The binary conversion circuit according to claim 8, wherein the conversion circuit converts the phase information to a plurality of pulse trains corresponding to a corresponding binary code.

10. The binary conversion circuit according to claim 6, wherein the upper-bit ripple counter section performs the count operation in response to the count clock or a carry signal from the lower-bit ripple counter section.

11. The binary conversion circuit according to claim 10, further comprising a selection section that selects either the count clock or the carry signal from the lower-bit ripple counter section to be supplied to the upper-bit ripple counter section.

12. An analog-to-digital (AD) converter comprising:
a comparator configured to compare an input voltage with a reference voltage having a ramp waveform whose voltage value varies linearly with time; and
the binary conversion circuit according to claim 6;
wherein the output signal is output by the comparator, the output signal having a level corresponding to a comparison result.

13. A solid-state imaging device comprising:
a pixel section including a plurality of pixels arranged in a matrix form, each of the pixels being configured to perform a photoelectric conversion; and
a pixel signal readout section that reads out a pixel signal from the pixel section in units of a plurality of pixels, wherein the pixel signal readout section includes the analog-to-digital (AD) converter according to claim 12, wherein the analog-to-digital (AD) converter is disposed to correspond to a column array of pixels so as to convert a readout analog signal to a digital signal.

14. A camera system comprising:

the solid-state imaging device according to claim 13; and an optical system that forms a subject image in the solid-state imaging device.

15. A binary conversion circuit comprising:

a latch circuit configured to receive a clock signal and an output signal, and latch phase information of the clock signal when a level of the output signal is inverted;

a conversion circuit configured to receive the latched phase information from the latch circuit and a pulse signal, and convert the latched phase information to a pulse train in response to the pulse signal; and a ripple counter section configured to receive the pulse train as a count clock and convert the phase information of the clock signal to a binary code by using the pulse train as a count clock, wherein the conversion circuit includes a first conversion circuit and a second conversion circuit, wherein the ripple counter section includes a first ripple counter section and a second ripple counter section, wherein the latch circuit includes four T-type flip-flops that latch different four clock signals, respectively, in which three consecutive T-type flip-flops form a first latch, and a remaining one of the four T-type flip-flops forms a second latch, wherein the binary conversion circuit further includes a selector that selects latched phase information of the three T-type flip-flops serving as the first latch of the latch circuit in response to a select signal, and a mask circuit that performs mask processing for determining whether or not latched phase information of the T-type flip-flop serving as the second latch of the latch circuit will be input to the second conversion circuit in response to a mask signal, wherein the first conversion circuit converts the four pieces of latched phase information of the latch circuit to a pulse train in response to a first pulse signal and outputs the converted signal as a count clock of the first ripple counter section; and wherein the second conversion circuit converts an output signal of the first ripple counter section or the latched phase information of the T-type flip-flop serving as the second latch, supplied via the mask circuit, to a count clock in response to a second pulse signal and outputs the count clock to the second ripple counter section that counts an upper bit.

16. The binary conversion circuit according to claim 15, wherein when a 4-bit BCD code is expressed by eight states 1000, 1100, 1110, 1111, 0111, 0011, 0001, and 0000, new eight states are formed from the initial eight states in such a way that most significant bit (MSB) values "1" and "0" are converted to "0" and "4," respectively, and lower bit values "0" and "1" other than the MSB are converted to "0" and "1," respectively, as they are, and BCD code values of the new eight states are added to obtain decimal numbers ranging between 0 to 7, the decimal numbers being used as the number of pulses.

17. A binary conversion circuit comprising:

a latch circuit configured to receive a clock signal and an output signal, and latch phase information of the clock signal when a level of the output signal is inverted;

a conversion circuit configured to receive the latched phase information from the latch circuit and a pulse signal, and convert the latched phase information to a pulse train in response to the pulse signal; and a ripple counter section configured to receive the pulse train as a count clock and convert the phase information of the clock signal to a binary code by using the pulse train as a count clock, wherein the latch circuit includes four T-type flip-flops that latch different four clock signals, respectively, in which three consecutive T-type flip-flops form a first latch, and a remaining one of the four T-type flip-flops forms a second latch, wherein the binary conversion circuit further includes a selector that selects latched phase information of the three T-type flip-flops serving as the first latch of the latch circuit in response to a select signal, and wherein the first conversion circuit converts the four pieces of latched phase information of the latch circuit to a pulse train in response to first and second pulse signals and outputs the converted signal as a count clock of the ripple counter section.

18. The binary conversion circuit according to claim 17, wherein when a 4-bit BCD code is expressed by eight states 1000, 1100, 1110, 1111, 0111, 0011, 0001, and 0000, new eight states are formed from the initial eight states in such a way that most significant bit (MSB) values "1" and "0" are converted to "1" and "2," respectively, and lower bit values "0" and "1" other than the MSB are converted to "0" and "1," respectively, as they are, and BCD code values of the new eight states are added to obtain decimal numbers ranging between 1 to 8, the decimal numbers being used as the number of pulses.

19. A binary conversion method comprising the steps of:

latching phase information of a clock signal when the level of an output signal is inverted;

converting the latched phase information to a pulse train in response to a pulse signal; and converting the phase information to a binary value by using the pulse train as a count clock, wherein when a 4-bit BCD code is expressed by eight states 1000, 1100, 1110, 1111, 0111, 0011, 0001, and 0000, new eight states are formed from the initial eight states in such a way that most significant bit (MSB) values "1" and "0" are converted to "0" and "4," respectively, and lower bit values "0" and "1" other than the MSB are converted to "0" and "1," respectively, as they are, and BCD code values of the new eight states are added to obtain decimal numbers ranging between 0 to 7, the decimal numbers being used as the number of pulses, or wherein when a 4-bit BCD code is expressed by eight states 1000, 1100, 1110, 1111, 0111, 0011, 0001, and 0000, new eight states are formed from the initial eight states in such a way that most significant bit (MSB) values "1" and "0" are converted to "1" and "2," respectively, and lower bit values "0" and "1" other than the MSB are converted to "0" and "1," respectively, as they are, and BCD code values of the new eight states are added to obtain decimal numbers ranging between 1 to 8, the decimal numbers being used as the number of pulses.

20. The binary conversion method according to claim 19, wherein the phase information is converted to a plurality of pulse trains corresponding to a corresponding binary code.

21. The binary conversion method according to claim 19, wherein the phase information of one clock is latched at a plurality of timings, and wherein the latched phase information of each clock is converted to a pulse train.

22. The binary conversion method according to claim 21, wherein the phase information is converted to a plurality of pulse trains corresponding to a corresponding binary code.

* * * * *